(12) United States Patent
Ishizuka et al.

(10) Patent No.: US 7,563,658 B2
(45) Date of Patent: Jul. 21, 2009

(54) METHOD FOR MANUFACTURING SEMICONDUCTOR DEVICE

(75) Inventors: Akihiro Ishizuka, Kanagawa (JP); Satoru Okamoto, Kanagawa (JP); Shigeharu Monoe, Tochigi (JP); Shunpei Yamazaki, Tokyo (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 292 days.

(21) Appl. No.: 11/314,011

(22) Filed: Dec. 22, 2005

(65) Prior Publication Data

US 2007/0015307 A1 Jan. 18, 2007

(30) Foreign Application Priority Data

Dec. 27, 2004 (JP) .............................. 2004-377688

(51) Int. Cl.
*H01L 21/20* (2006.01)

(52) U.S. Cl. .................. 438/162; 438/166; 438/438; 438/473; 438/486; 257/E21.133; 257/E21.413; 257/E21.414; 257/E27.111; 257/E27.113; 257/E29.151; 257/E29.275; 257/E29.278; 257/E29.282; 257/E29.293

(58) Field of Classification Search .......... 257/E21.161, 257/E33.064, E31.126, E21.133, 413, 414, 257/E27.111, 113, E29.151, 275, 278, 282, 257/293; 438/592, 629, 669, 162, 166, 473, 438/486

See application file for complete search history.

(56) References Cited

U.S. PATENT DOCUMENTS

| 5,623,157 | A | 4/1997 | Miyazaki et al. | |
|---|---|---|---|---|
| 6,475,889 | B1 * | 11/2002 | Ring | 438/571 |
| 6,596,571 | B2 * | 7/2003 | Arao et al. | 438/163 |
| 6,657,260 | B2 | 12/2003 | Yamazaki et al. | |
| 6,673,643 | B2 * | 1/2004 | Yamazaki | 438/30 |
| 6,690,437 | B2 * | 2/2004 | Yamazaki et al. | 349/110 |
| 6,759,678 | B2 * | 7/2004 | Yamazaki et al. | 257/59 |
| 6,858,480 | B2 * | 2/2005 | Nakamura et al. | 438/162 |
| 6,881,529 | B2 * | 4/2005 | Iwasaki | 430/166 |
| 6,911,688 | B2 * | 6/2005 | Yamazaki et al. | 257/296 |
| 6,960,786 | B2 | 11/2005 | Yamazaki et al. | |
| 7,015,080 | B2 | 3/2006 | Ishikawa | |
| 2002/0158288 | A1 | 10/2002 | Yamazaki et al. | |
| 2002/0185466 | A1 * | 12/2002 | Furuta et al. | 216/23 |
| 2003/0076282 | A1 | 4/2003 | Ikeda et al. | |

(Continued)

FOREIGN PATENT DOCUMENTS

JP          04-073651          3/1992

(Continued)

*Primary Examiner*—Michael S Lebentritt
(74) *Attorney, Agent, or Firm*—Nixon Peabody LLP; Jeffrey L. Costellia

(57) ABSTRACT

The present invention relates to a method for manufacturing a semiconductor film, including the steps of forming a transparent conductive film, forming a first conductive film over the transparent conductive film, forming a second conductive film over the first conductive film, etching the second conductive film with a gas including chlorine, and etching the first conductive film with a gas including fluorine. During etching of the second conductive film with a gas including chlorine, the transparent conductive film is protected by the first conductive film. During etching of the first conductive film with the gas including fluorine, the transparent conductive film does not react with the gas including fluorine. Therefore, no particle is formed.

19 Claims, 21 Drawing Sheets

U.S. PATENT DOCUMENTS

2003/0189207 A1 10/2003 Murakami et al.
2003/0230764 A1 12/2003 Yamazaki et al.
2004/0072380 A1 4/2004 Yamazaki et al.
2004/0164296 A1 8/2004 Yamazaki et al.
2005/0029613 A1* 2/2005 Fujisawa et al. ............ 257/436
2005/0092996 A1 5/2005 Yamazaki et al.
2006/0128080 A1 6/2006 Ishikawa

FOREIGN PATENT DOCUMENTS

| JP | 2001-188240 | 7/2001 |
| JP | 2003-174173 | 6/2003 |
| JP | 2003-195838 | 7/2003 |

* cited by examiner

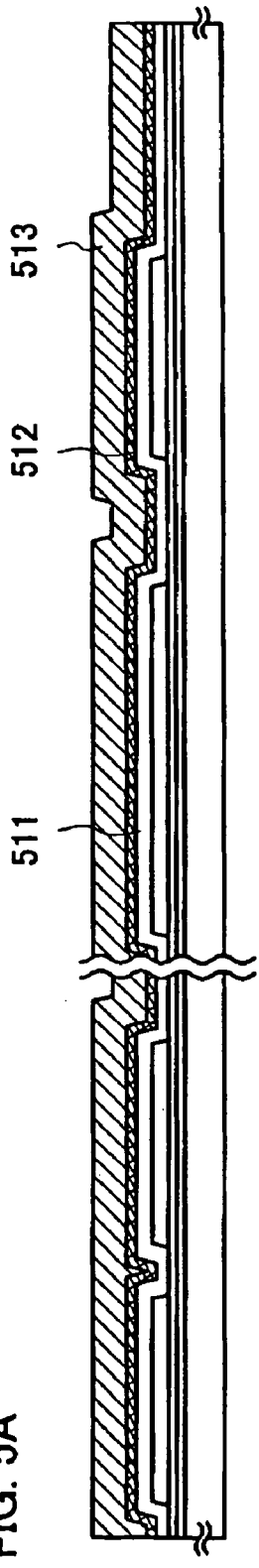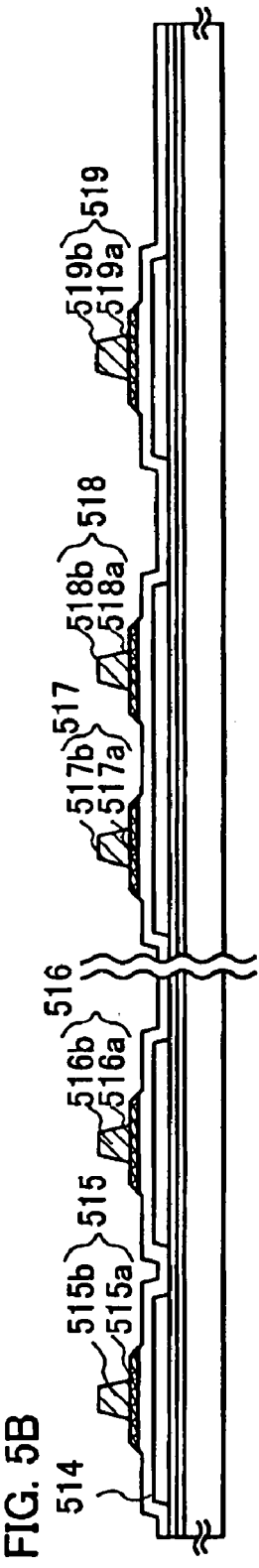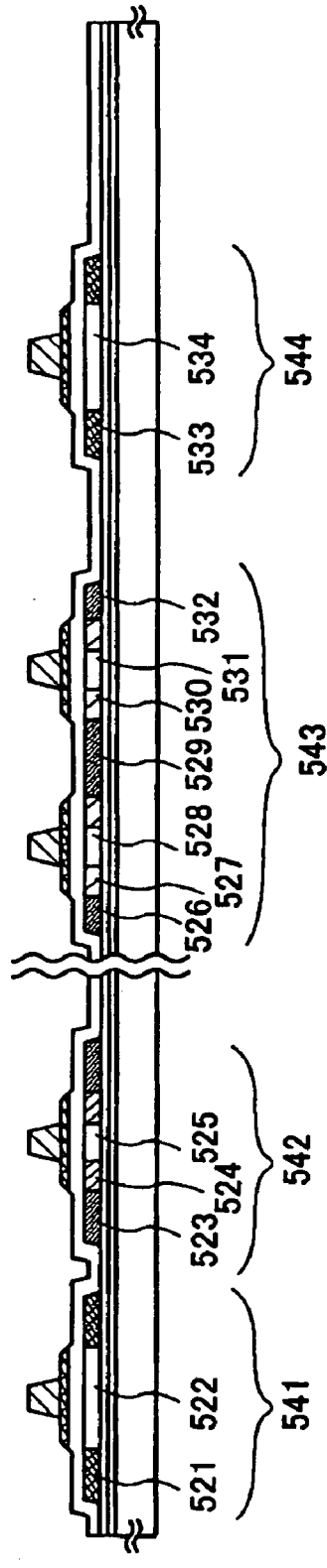

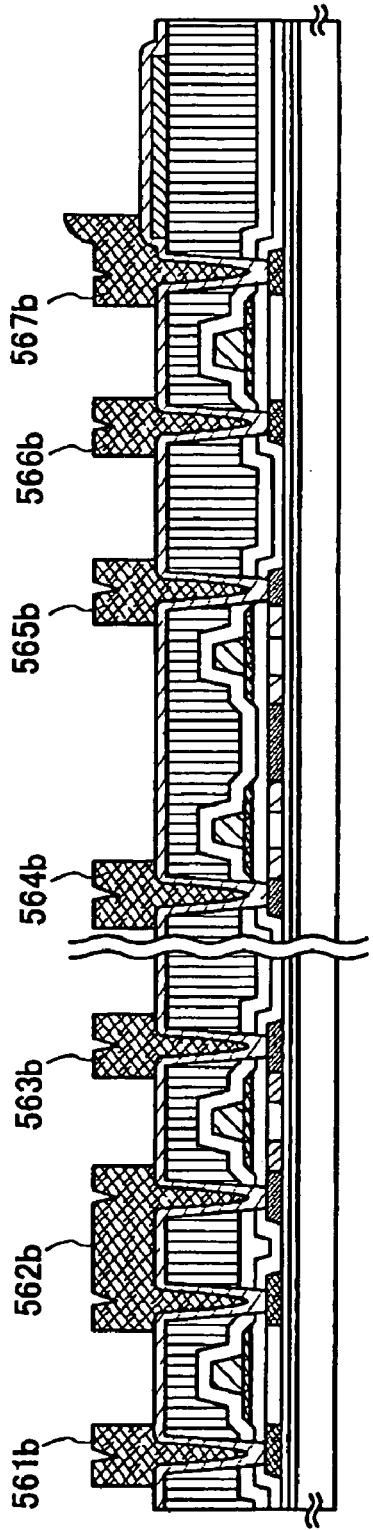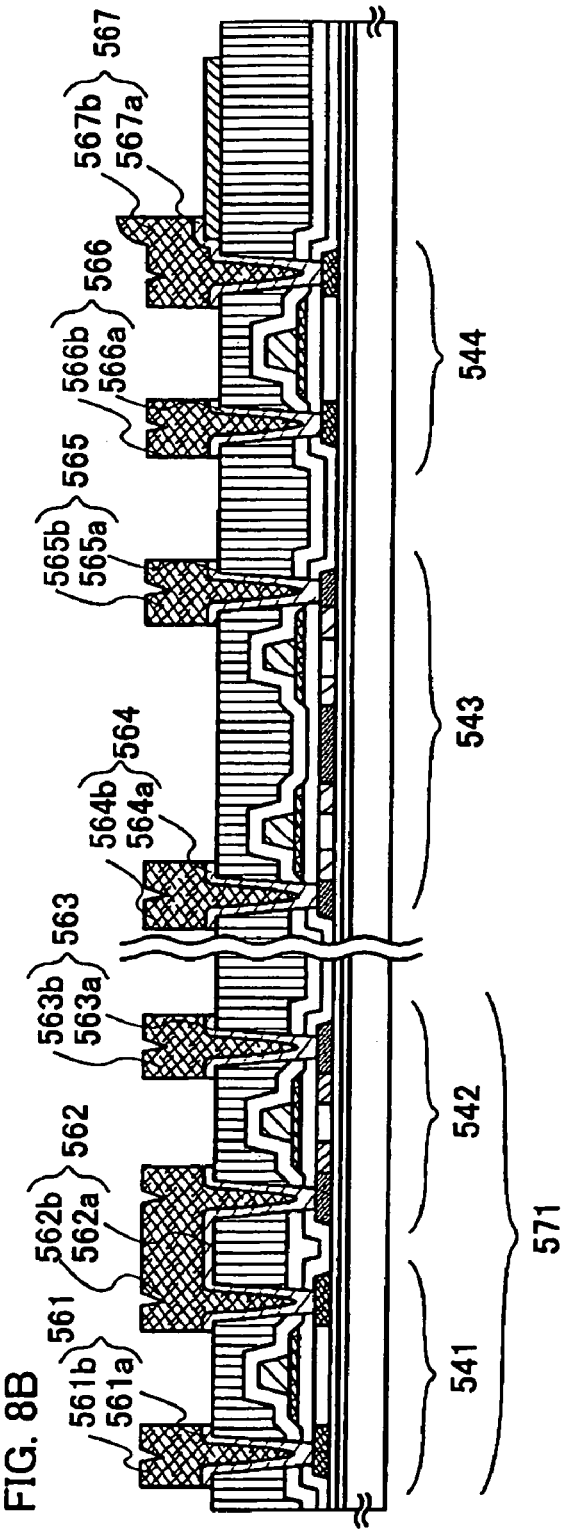
FIG. 8A
FIG. 8B

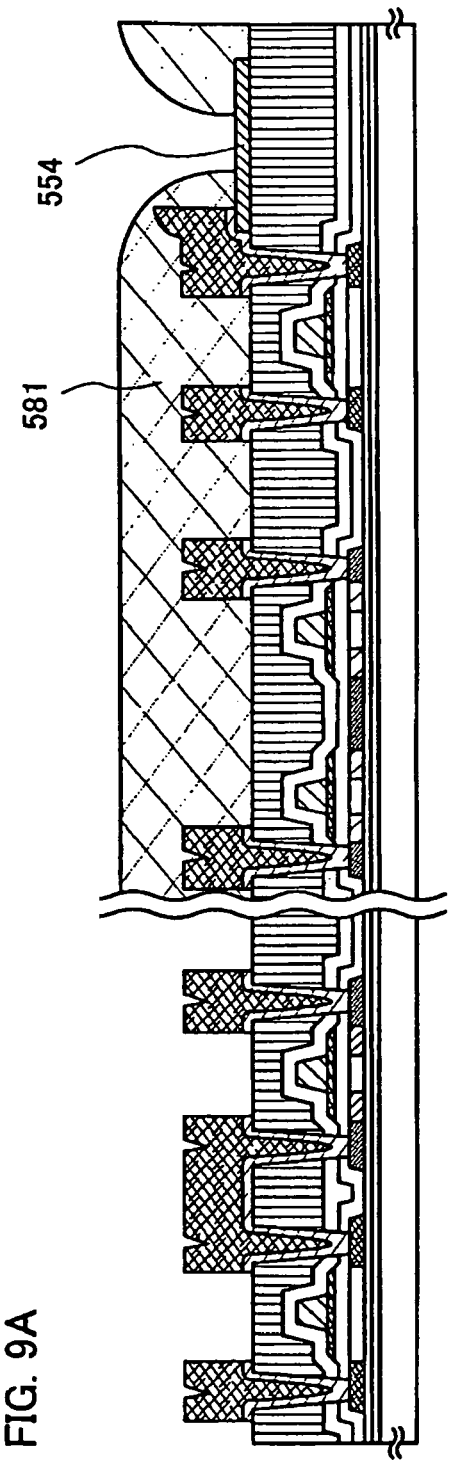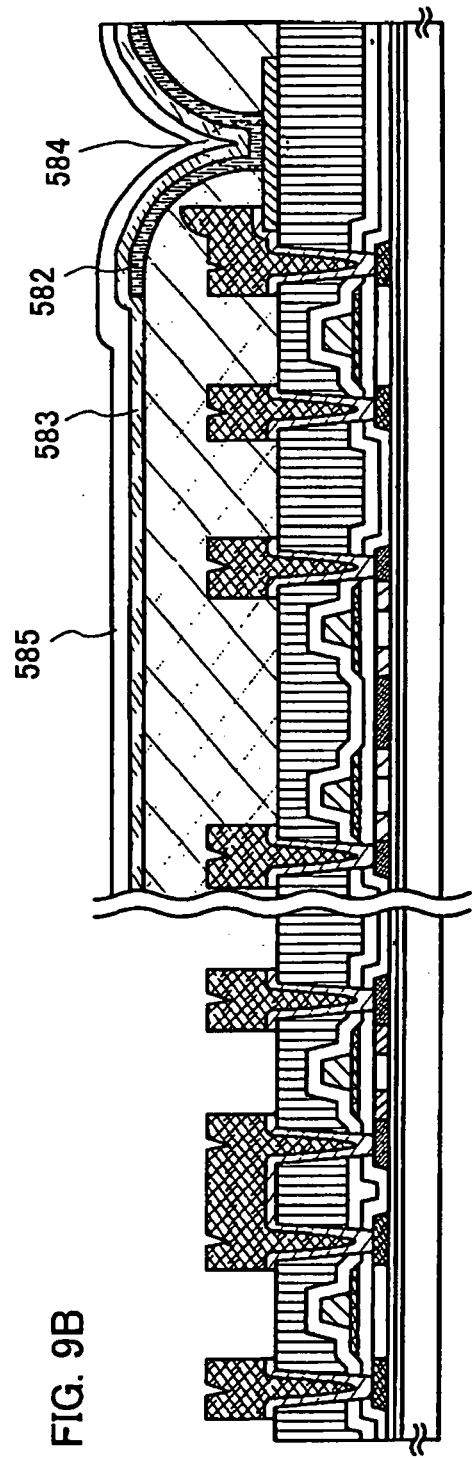
FIG. 9A
FIG. 9B

P.R(2000nm)/Al(700nm)/Mo(100nm)/ITO(110nm)/SiON(200nm)/glass substrate

| Step | ICP (W) | BIAS (W) | Pressure (Pa) | BCl3 (sccm) | Cl2 (sccm) | CF4 (sccm) | O2 (sccm) | just (sec) | total (sec) |
|---|---|---|---|---|---|---|---|---|---|
| 1st. | 450 | 100 | 1.9 | 60 | 20 | – | – | 140 | 200 |
| 2nd. | 400 | 50 | 3.5 | – | – | 60 | 40 | 72 | 132 |

P.R(2000nm)/Al(700nm)/Mo(100nm)/ITO(110nm)/SiON(200nm)/glass substrate

| Step | ICP (W) | BIAS (W) | Pressure (Pa) | BCl3 (sccm) | Cl2 (sccm) | CF4 (sccm) | O2 (sccm) | just (sec) | total (sec) |
|------|---------|----------|---------------|-------------|------------|------------|-----------|------------|-------------|
| 1st. | 450 | 100 | 1.9 | 60 | 20 | - | - | 132 | 192 |
| 2nd. | 400 | 50 | 3.5 | - | - | 60 | 40 | 72 | 132 |

P.R(2000nm)/Al(700nm)/Ti(100nm)/ITO(110nm)/SiON(200nm)/glass substrate

| Step | ICP (W) | BIAS (W) | Pressure (Pa) | BCl3 (sccm) | Cl2 (sccm) | CF4 (sccm) | just (sec) | total (sec) |
|---|---|---|---|---|---|---|---|---|
| 1st. | 450 | 100 | 1.9 | 60 | 20 | - | 130 | 280 |
| 2nd. | - | - | - | - | - | - | - | - |

US 7,563,658 B2

METHOD FOR MANUFACTURING SEMICONDUCTOR DEVICE

BACKGROUND OF THE INVENTION

1. Technical Field

The present invention relates to a method for etching a laminate film laminated a plurality of conductive films and to a method for manufacturing a semiconductor device using such conductive films.

2. Background Art

Recently, development of display devices have been getting more and more active, and miniaturization of individual elements constituting the display devices has been desired.

For miniaturization of an element, a high-accuracy etching technique is necessary. Typically, an electrode or a wiring is formed by forming a conductive film and by wet etching or dry etching. However, dry etching is more suitable for forming a minute structure (refer to Japanese Patent No. 2734753, Japanese Patent Laid-Open No. 2001-188240, and Japanese Patent Laid-Open No. 2003-174173).

For this element, a low-resistance conductive film, for example, a conductive film including aluminum (Al) as its main component is used as a material for forming an electrode or a wiring. It is often the case that a gas including chlorine, such as $Cl_2$, $BCl_3$, $SiCl_4$, or $CCl_4$, is used for dry etching of aluminum.

Now, it is often the case that a transparent conductive film is provided in a pixel portion of a display device, and an electrode is formed by laminating a transparent conductive film and a low-resistance conductive film as described above in order to decrease the resistance and improve contact with an element such as a thin film transistor. However, it has been found that, during etching of the transparent conductive film by dry etching, an etching gas reacts with the conductive film to produce fine particles.

In FIG. 2(A) and FIG. 2(B), reference numeral 1001 denotes an indium tin oxide alloy (Indium Tin Oxide (ITO)) film that is a transparent conductive film, and reference numeral 1002 denotes an aluminum film (Al film). After forming the Al film 1002 on the ITO film 1001 (FIG. 2(A)), the Al film 1002 is etched. However, when a chlorine-based gas, for example, a mixed gas of $BCl_3$ and $Cl_2$, is used as the etching gas, the ITO film 1001 reacts with chlorine (Cl) in the mixed gas to form fine particles 1003 on the periphery of the etched region while the Al film is etched (FIG. 2(B)).

In addition, FIG. 3(A) and FIG. 3(B) show an example in which a titanium film (Ti film) is formed between an ITO film and an Al film. Reference numerals 1101, 1102, and 1103 denote the ITO film, the Ti film, and the Al film (FIG. 3(A)). However, when the Al film 1103 and the Ti film 1102 are continuously etched with a gas including chlorine, for example, a mixed gas of $BCl_3$ and $Cl_2$, as an etching gas, the ITO film 1101 formed under the Ti film 1102 is exposed, and chlorine (Cl) reacts with the ITO film 1101. The result is that fine particles 1104 are produced as in FIG. 2(B) (FIG. 3(B)).

These particles cause a short circuit between the transparent conductive film and other conductive film, and for example, cause a point defect or a line defect in a pixel portion when a display device is manufactured.

SUMMARY OF THE INVENTION

It is an object of the present invention to prevent these fine particles from being formed and manufacture a semiconductor device that has favorable characteristics.

First, lower-layer, middle-layer, and upper-layer conductive films are formed. In this case, the lower-layer conductive film is a transparent conductive film, and is formed of a material that is not etched with a gas including fluorine. In addition, the middle-layer conductive film is formed of a material that does not react with a gas including chlorine but is etched with a gas including fluorine.

Next, plasma is generated with the use of a gas including chlorine, and the upper-layer conductive film is etched by dry etching. In this case, the gas including chlorine does not react with the bottom-layer conductive film since the lower-layer conductive film is protected by the middle-layer conductive film. In addition, the middle-layer conductive film is formed of a material that does not react with the gas including chlorine, and therefore acts as an etching stopper for the upper-layer conductive film.

Next, the middle-layer conductive film is etched by dry etching with a gas including fluorine. However, since the gas including fluorine does not react with the lower-layer conductive film, no reaction product is produced from the bottom-layer film and fluorine to form no particles. In addition, the bottom-layer conductive film acts as an etching stopper in this case.

The present invention relates to a method for manufacturing a semiconductor device, including the steps of forming a transparent conductive film, forming a first conductive film over the transparent conductive film, forming a second conductive film over the first conductive film, etching the second conductive film with a gas including chlorine, and etching the first conductive film with a gas including fluorine.

Further, as another aspect, the present invention relates to a method for manufacturing a semiconductor device, including the steps of forming a semiconductor film over a substrate with an insulating surface, forming an insulating film to cover the semiconductor film, forming a transparent conductive film over the insulating film, forming a contact hole in the insulating film, forming a first conductive film over the transparent conductive film and in the contact hole, forming a second conductive film over the first conductive film, etching the second conductive film with a gas including chlorine, and etching the first conductive film with a gas including fluorine, where the transparent conductive film is electrically connected to the semiconductor film.

Further, as another aspect, the present invention relates to a method for manufacturing a semiconductor film, including the steps of forming a semiconductor device over a substrate with an insulating surface, forming an insulating film to cover the semiconductor film, forming a transparent conductive film over the insulating film, forming a contact hole in the insulating film, forming a first conductive film over the transparent conductive film and in the contact hole, forming a second conductive film over the first conductive film, etching the second conductive film with a gas including chlorine, etching the first conductive film with a gas including fluorine, and forming an organic compound layer including a light-emitting layer on the transparent conductive film, wherein the transparent conductive film is electrically connected to the semiconductor film.

In the present invention, the transparent conductive film is any one of an indium tin oxide alloy (Indium Tin Oxide (ITO)) film, an indium tin oxide alloy film containing silicon (Si), a zinc oxide (ZnO) film, a tin oxide ($SnO_2$) film, an indium oxide (InO) film, and an indium oxide-zinc oxide (IZO) alloy film of indium oxide (InO) mixed with 2 to 20 atomic % zinc oxide (ZnO).

In the present invention, the first conductive film includes any one of metals such as molybdenum (Mo), tungsten (W), tantalum (Ta), chromium (Cr), a nitride thereof, and an alloy thereof.

In the present invention, the second conductive film is any one of an aluminum film, an aluminum alloy film including at least one element of nickel (Ni), molybdenum (Mo), silicon (Si), titanium (Ti), neodymium (Nd), and copper (Cu), and an aluminum alloy film including at least one element of nickel (Ni), molybdenum (Mo), silicon (Si), titanium (Ti), neodymium (Nd), and copper (Cu) and including carbon.

In the present invention, the gas including chlorine is a gas including any one of $Cl_2$, $BCl_3$, $SiCl_4$, and $CCl_4$.

In the present invention, the gas including fluorine is a gas including any one of $CF_4$, $SF_6$, and $NF_3$.

In the present invention, an organic compound layer including a light-emitting layer is formed over the transparent conductive film.

According to the present invention, since a transparent conductive film can be prevented from reacting with a chlorine-based gas during etching of a conductive film, fine particles can be prevented from being formed, and a semiconductor device that has favorable characteristics can be manufactured.

BRIEF DESCRIPTION OF THE DRAWINGS

FIG. 5 illustrates the manufacturing process of the semiconductor device according to the present invention.

FIG. 8 illustrates the manufacturing process of the display device according to the present invention.

FIG. 9 illustrates a manufacturing process of a display device according to the present invention.

DETAILED DESCRIPTION OF THE PREFERRED EMBODIMENTS

An embodiment mode of the present invention will be described in detail with reference to the drawings. However, the present invention is not limited to the following description, and it is to be easily understood by those skilled in the art that various changes in form and details may be made without departing from the spirit and scope of the invention. Accordingly, the present invention is not to be considered interpreted with limitation to the description of the following embodiment mode. It is to be noted that in structures according to the present invention to be described below, the same numerals are used in common among different drawings for the same portions or portions that have like functions, and repeated descriptions thereof will be omitted.

The present embodiment mode will be described with reference to FIGS. 1(A) to 1(C).

Figure 1A:
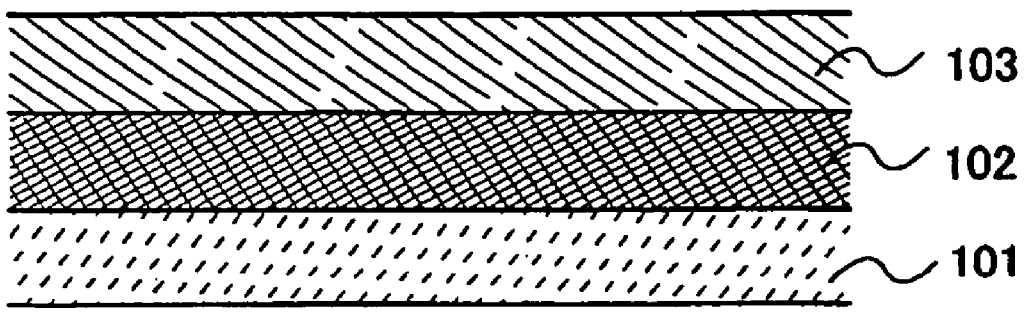
FIG. 1 illustrates a manufacturing process of a semiconductor device according to the present invention.

First, a first conductive film 101, a second conductive film 102, and a third conductive film 103 are laminated (FIG. 1(A)). For the conductive film 101, a transparent conductive film such as an indium tin oxide alloy (also referred to as an indium tin oxide) (Indium Tin Oxide (ITO)), an ITO containing silicon (Si), a zinc oxide (ZnO), a tin oxide ($SnO_2$), an indium oxide, and an indium oxide-zinc oxide (IZO) alloy of indium oxide mixed with 2 to 20 atomic % zinc oxide (ZnO) is used, and an ITO film containing Si is formed in the present embodiment mode. The ITO film containing Si may be formed by sputtering with the use of targets of an ITO and a silicon oxide ($SiO_2$).

In addition, as the second conductive film 102, metals such as molybdenum (Mo), tungsten (W), tantalum (Ta), and chromium (Cr), nitrides thereof, and alloys thereof can be used, and a molybdenum (Mo) film is formed by sputtering in the present embodiment mode.

Further, as the third conductive film 103, a film including aluminum as its main component is formed by sputtering. For the film including aluminum as its main component, an aluminum film, an aluminum alloy film including at least one element of nickel, molybdenum (Mo), silicon (Si), titanium (Ti), neodymium (Nd), and copper (Cu), or an aluminum alloy film including at least one element of nickel, molybdenum (Mo), silicon (Si), titanium (Ti), neodymium (Nd), and copper (Cu) and including carbon (C) can be used. It is preferable that the aluminum alloy film including carbon include at least one of nickel, molybdenum (Mo), silicon (Si), titanium (Ti), neodymium (Nd), and copper (Cu) at 0.5 to 7.0 atomic % and include carbon at 0.1 to 3.0 atomic %.

Figure 1B:
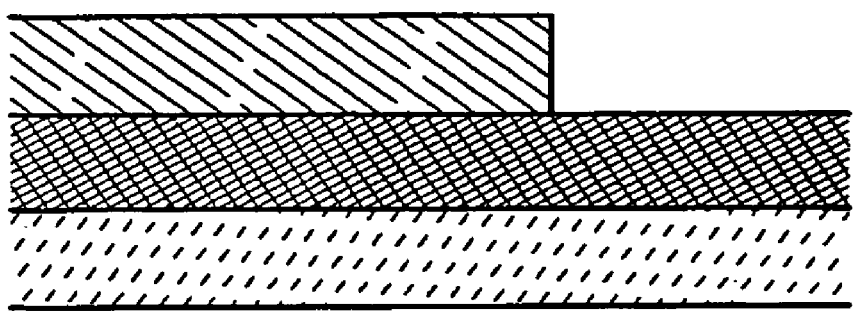
Figure 1C:
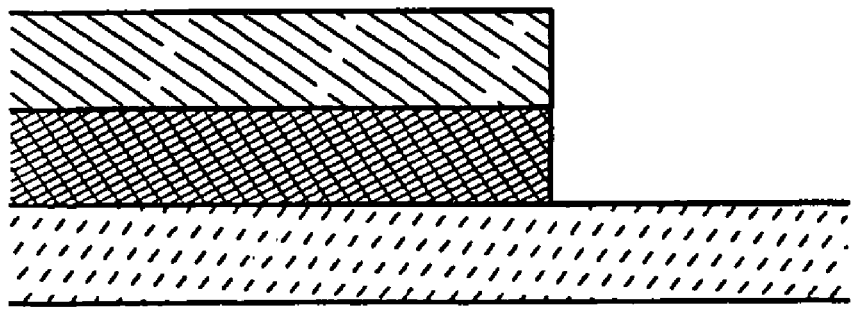
Figure 2A:
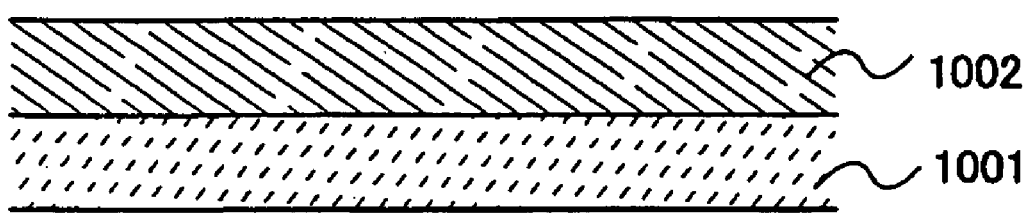
FIG. 2 illustrates a conventional manufacturing process of a semiconductor device.
Figure 2B:
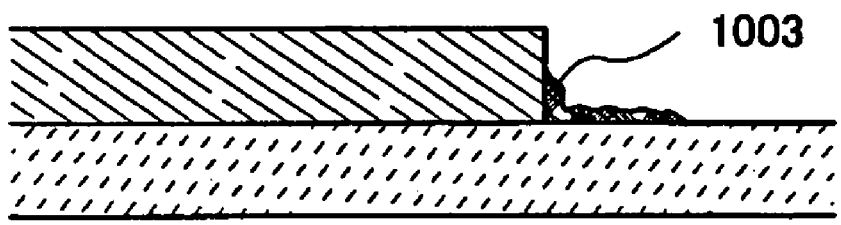

Next, a mask is formed on the third conductive layer 103, and the third conductive film 103 is etched by dry etching (FIG. 1(B)).

As the etching gas, a gas including chlorine, for example, a gas including any one of $Cl_2$, $BCl_3$, $SiCl_4$, and $CCl_4$ may be used. In addition, an inert gas may be added to the etching gas to be used. As the inert element to be added, one or more elements selected from He, Ne, Ar, Kr, and Xe can be used.

In the present embodiment mode, dry etching of the third conductive film 103 is carried out by using a mixed gas of $BCl_3$ and $Cl_2$ and flowing $BCl_3$ and $Cl_2$ respectively at flow rates of 60 sccm and 20 sccm.

At this stage, the second conductive film 102 serves as an etching stopper, and the first conductive film 101 has no contact with the mixed gas of $BCl_3$ and $Cl_2$. Therefore, particles can be prevented from being produced.

Next, dry etching of the second conductive film 102 is carried out with the first conductive film 101 as an etching stopper. As the etching gas, a gas including fluorine, for example, a gas including any one of $CF_4$, $SF_6$, and $NF_3$ may be used to carry out the etching. In the present embodiment mode, dry etching of the second conductive film 102 is carried out by flowing $CF_4$ and $O_2$ respectively at flow rates of 30 to 60 sccm and 40 to 70 sccm (FIG. 1(C)).

This makes it possible to etch only the second conductive film 102. Since $CF_4$ or $O_2$ does not react with the first conductive film 101, fine particles are not formed.

According to the present invention, during etching of the third conductive film 103 with the gas including chlorine, the first conductive film 101 is not exposed to the gas including chlorine to form no particle since the second conductive film 102 is formed on the first conductive film 101. Further, since the gas including fluorine, which does not react with the first conductive film 101, is used during etching of the second conductive film 102, no particle is produced either in this case. Accordingly, a favorable semiconductor device can be manufactured according to the present invention.

Embodiment 1

Figure 18:
FIG. 18 is an electron microscope photograph of a structure of the present invention.
Figure 19:
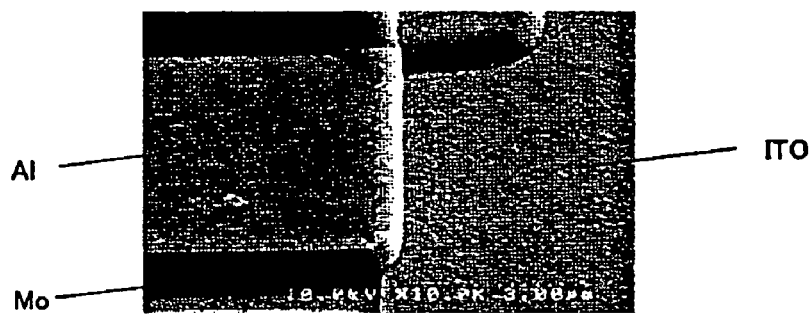
FIG. 19 is an electron microscope photograph of a structure of the present invention.
Figure 20:
FIG. 20 is an electron microscope photograph of a conventional structure.

In the present embodiment, a structure of the present invention will be compared with a conventional structure with reference to FIGS. 18, 19, and 20.

FIGS. 18 and 19 show scanning electron microscope photographs for the case of forming a silicon oxide film containing nitrogen, an indium tin oxide alloy (ITO) film, a molybdenum (Mo) film, and an aluminum (Al) film on a glass substrate and carrying out etching under conditions shown in Table 1.

TABLE 1(A)

| | ICP [W] | BIAS [W] | Press [Pa] | CF4 [sccm] | O2 [sccm] | Process time (sec) |
|---|---|---|---|---|---|---|
| Condition (A) | 400 | 50 | 3.5 | 60 | 40 | 120 |

| | pure-Al | | Mo | | SiON | | ITO | |
|---|---|---|---|---|---|---|---|---|
| E/R | | | | | | | | |
| [nm/min] | p.n.u. [%] | E/R [nm/min] | p.n.u. [%] | E/R [nm/min] | p.n.u. [%] | E/R [nm/min] | p.n.u. [%] |
| 5.1 | 43.47 | 83.3 | 8.52 | 93.3 | 4.96 | 2.4 | 82.00 |

| Mo/pure-Al | | Mo/SiON | | Mo/ITO | |
|---|---|---|---|---|---|
| sele. | p.n.u. [%] | sele. | p.n.u. [%] | sele. | p.n.u. [%] |
| 17.9 | 48.77 | 1.1 | 6.19 | 51.6 | 104.77 |

TABLE 1(B)

| | ICP [W] | BIAS [W] | Press [Pa] | Cl2 [sccm] | BCl3 [sccm] | Process time (sec) |
|---|---|---|---|---|---|---|
| Condition (B) | 450 | 100 | 1.9 | 20 | 60 | 60&180 |

| pure-Al | | Mo | | pure-Al/Mo | |
|---|---|---|---|---|---|
| E/R [nm/min] | p.n.u. [%] | E/R [nm/min] | p.n.u. [%] | sele. | p.n.u. [%] |
| 223.9 | 2.77 | 8.9 | 46.67 | 29.4 | 64.47 |

It is to be noted that Table 1(A) shows conditions for $CF_4$ or $O_2$ during etching of the molybdenum (Mo) film and Table 1 (B) shows conditions for $BCl_3$ and $Cl_2$ during etching of the aluminum (Al) film.

It is to be noted that FIG. 18 is a scanning electron microscope photograph before removing a resist and FIG. 19 is a scanning electron microscope photograph after removing the resist. In FIG. 19, the aluminum film is exposed since the resist is removed.

As understood from FIGS. 18 and 19, it is determined that etching is well carried out with no fine particle produced.

Figure 3A:
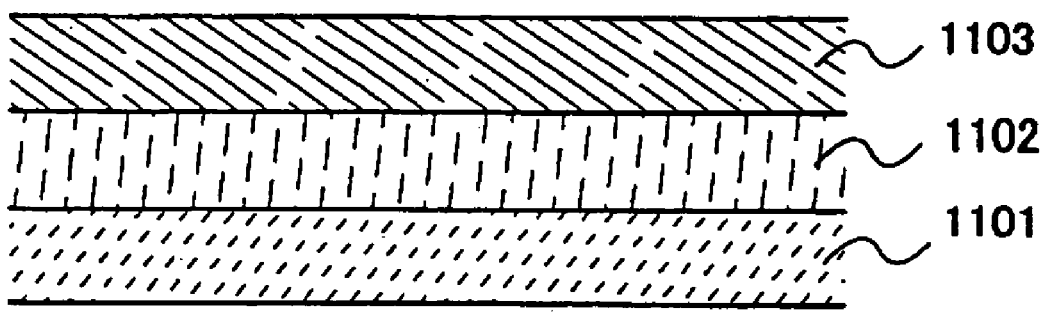
FIG. 3 illustrates a conventional manufacturing process of a semiconductor device.
Figure 3B:
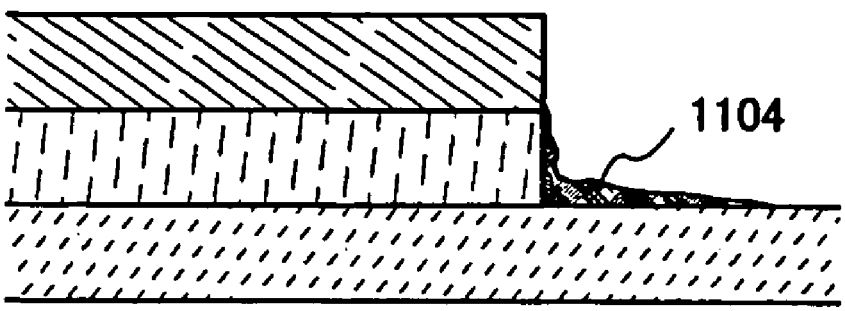

FIG. 20 shows, as a comparative example, a scanning electron microscope photograph for the case of forming a silicon oxide film containing nitrogen, an indium tin oxide alloy (ITO) film, a titanium (Ti) film, and an aluminum (Al) film on a glass substrate and carrying out etching under conditions shown in Table 1(B). FIG. 20 corresponds to the above-described laminated structure in FIG. 3, and the difference between FIG. 20 and FIGS. 18 and 19 is that the titanium (Ti) film is used in FIG. 20 while the molybdenum (Mo) film is used in FIGS. 18 and 19.

It is to be noted that a resist on the aluminum film is left in FIG. 20 without being removed.

In FIG. 20, it is determined that chlorine reacts with the ITO to result in fine particles produced at the stage of etching with $BCl_3$ and $Cl_2$.

In addition, Table 1(A) shows that the etching selectivity (sele.) of the Mo to the ITO has a large value of 51.6, which is relatively favorable.

It is believed that the reason why the etching selectivity is large under the conditions in Table 1 (A) is that the amount of $O_2$ is appropriate to $CF_4$.

When $O_2$ is added to $CF_4$, $CF_4$ reacts with $O_2$ to form CO and F and generate F radicals or F ions. When $O_2$ is small in amount, etching is insufficient because of a small amount of F radicals or F ions. On the other hand, when $O_2$ is excessive in amount, wrap-around is caused to result in excessive etching.

Thus, the present invention is found to be useful for preventing fine particles from being produced in etching of a conductive film on an ITO film.

Embodiment 2

An example of using a method for manufacturing a semiconductor device using the present invention will be described with reference to FIGS. 4(A) to 4(D), FIGS. 5(A) to 5(C), FIGS. 6(A) to 6(C), FIGS. 7(A) to 7(C), and FIGS. 8(A) and 8(B).

Figure 4A:
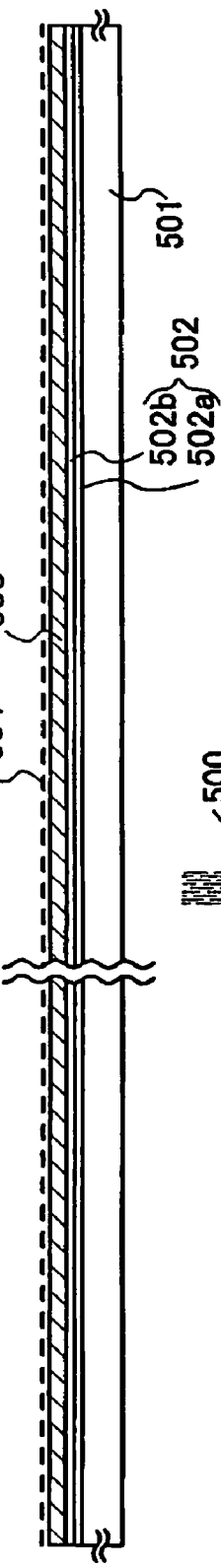
FIG. 4 illustrates a manufacturing process of a semiconductor device according to the present invention.

First, as shown in FIG. 4(A), a base film 502 is formed on a substrate 501. For the substrate 501, for example, a glass substrate such as barium borosilicate glass or alumino-borosilicate glass, a quartz substrate, a stainless steel substrate, and the like can be used. In addition, it is also possible to use a substrate composed of a plastic typified by PET (polyethylene terephthalate), PES (polyether sulfone), and PEN (polyethylene Naphtahalat) or a flexible synthetic resin such as acrylic.

The base film 502 is provided to prevent an alkali metal or an alkali-earth metal, such as Na, included in the substrate 501 from diffusing into a semiconductor film to have an adverse effect on characteristics of a semiconductor element.

Silicon oxide, silicon nitride, silicon oxide containing nitrogen, silicon nitride containing oxygen, and the like can be used as the base film 502, and the base film 502 may be a single layer or have a laminated structure of two layers or three layers. In addition, it is effective to provide a base film with the object of prevention of impurity diffusion in the case of using a substrate somewhat including an alkali metal or an alkali-earth metal, such as a glass substrate, a stainless steel substrate, or a plastic substrate. However, when impurity diffusion gives almost no problems as in the case of a quartz substrate, a base film does not always have to be provided.

In the present embodiment, a silicon nitride film 502a containing oxygen is formed on the substrate to have a film thickness of 50 nm with $SiH_4$, $NH_3$, $N_2O$, $N_2$ and $H_2$ as a reaction gas, and a silicon oxide film 502b containing nitrogen is formed thereon to have a film thickness of 100 nm with $SiH_4$ and $N_2O$ as a reaction gas. Alternatively, the film thickness of the silicon nitride film containing oxygen may be made to be 140 nm, and the film thickness of the laminated silicon oxide film containing nitrogen may be made to be 100 nm.

Next, a semiconductor film 503 is formed on the base film 502. The film thickness of the semiconductor film 503 is made to be 25 to 100 nm (preferably 30 to 60 nm). It is to be noted that not only silicon (Si) but also silicon-germanium (SiGe) can be used for the semiconductor. In the case of using silicon germanium, it is preferable that the germanium concentration be approximately 0.01 to 4.5 atomic %.

For the semiconductor film 503, an amorphous semiconductor (hereinafter, also referred to as "an amorphous semiconductor") that is manufactured by vapor deposition or sputtering using a semiconductor material gas such as a silane or germane, a semi-amorphous semiconductor (also referred to as a microcrystal, and hereinafter also referred to as "SAS"), or the like can be used.

The SAS is a semiconductor that has an intermediate structure between amorphous and crystalline (including single crystalline and polycrystalline) structures and has a third state that is stable in terms of free energy, and includes a crystalline region that has a short-range order with lattice distortion. In at least a region of the film, a crystal region of 0.5 to 20 nm can be observed. In the case of including silicon as its main component, Raman spectrum is shifted toward wavenumbers lower than 520 $cm^{-1}$. The diffraction peaks of (111) and (220), which are believed to be derived from the silicon crystal lattice, are observed in X-ray diffraction. For terminating dangling bonds, at least 1 atomic % or more hydrogen or halogen is included. The SAS is formed by glow discharge decomposition (plasma CVD) of a silicide gas. As the silicide gas, $SiH_4$, $Si_2H_6$, $SiH_2Cl_2$, $SiHCl_3$, $SiC_4$, $SiF_4$ or the like can be used, which may be further mixed with $F_2$ or $GeF_4$. The silicide gas may be diluted with $H_2$ or with $H_2$ and one or more rare gas elements selected from He, Ar, Kr and Ne. The dilution ratio is in the range of 2 to 1000 times, the pressure is approximately in the range of 0.1 to 133 Pa, the power supply frequency is 1 to 120 MHz, preferably, 13 to 60 MHz. It is preferable that the substrate heating temperature be 300° C. or less, and the SAS can be formed also at a substrate heating temperature of 100 to 200° C. Now, as for impurity elements taken mainly during deposition, it is preferable that the concentration of impurities derived from atmospheric components such as oxygen, nitrogen and carbon be made to be $1\times10^{20}$ $cm^{-3}$ or less, and in particular, the oxygen concentration be made to be $5\times10^{19}$ $cm^{-3}$ or less, more preferably $1\times10^{19}$ $cm^{-3}$ or less. In addition, when a rare gas element such as helium, argon, krypton or neon is included to further promote the lattice distortion, a favorable SAS with stability increased can be obtained. Alternatively, as the semiconductor film, an SAS layer that is formed by using a hydrogen-containing gas may be stacked on an SAS layer that is formed by using a fluorine-containing gas.

The amorous semiconductor typically includes hydrogenated amorphous silicon. In addition, as described above, a semi-amorphous semiconductor or a semiconductor including a crystalline phase as part of a semiconductor film can be also used.

In the present embodiment, as the semiconductor film 503, an amorphous silicon film is formed by plasma CVD to be 54 nm thick.

Next, a metal element that promotes crystallization of a semiconductor is introduced into the semiconductor film 503. The method for introducing the metal element into the semiconductor film 503 is not limited as long as the technique is able to make the metal element exist on the surface of or inside the semiconductor film 503, and for example, sputtering, CVD, a plasma treatment (including plasma CVD), an absorption method, and a method of applying a solution of a metal salt can be used. Among these, the method of using a solution is simple, and useful on the point that the concentration of the metal element is easily controlled. In addition, in this case, it is desirable to form an oxide film by UV light irradiation in an oxygen atmosphere, thermal oxidation, a treatment with ozone water including a hydroxyl radical or hydrogen peroxide, or the like in order to improve the surface wettability of the semiconductor film 503 and spread the solution over the entire surface of the amorphous semiconductor film.

As the metal element that promotes crystallization of a semiconductor, one or more elements selected from nickel (Ni), germanium (Ga), iron (Fe), palladium (Pd), tin (Sn), lead (Pb), cobalt (Co), platinum (Pt), copper (Cu), and gold (Au) can be used. In the present embodiment, nickel (Ni) is used as the metal element, and a liquid-phase nickel acetate solution 504 is applied to the surface of the semiconductor film 503 by spin coating (FIG. 4(A)).

Next, hydrogen in the semiconductor film 503 is released by keeping at a temperature of 450 to 500° C. for 1 hour in a nitrogen atmosphere. This is for reducing threshold energy in subsequent crystallization by purposely forming dangling bonds in the semiconductor film 503.

Then, by performing a heat treatment at a temperature of 550 to 600° C. for 4 to 8 hours in a nitrogen atmosphere, the semiconductor film 503 is crystallized to obtain a crystalline semiconductor film 505. This metal element makes the crystallization temperature of the semiconductor film 503a relatively low temperature of 550 to 600° C.

Figure 4B:
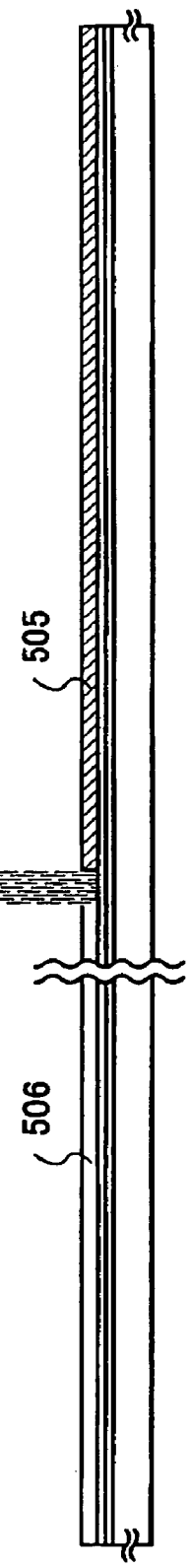
Figure 4C:
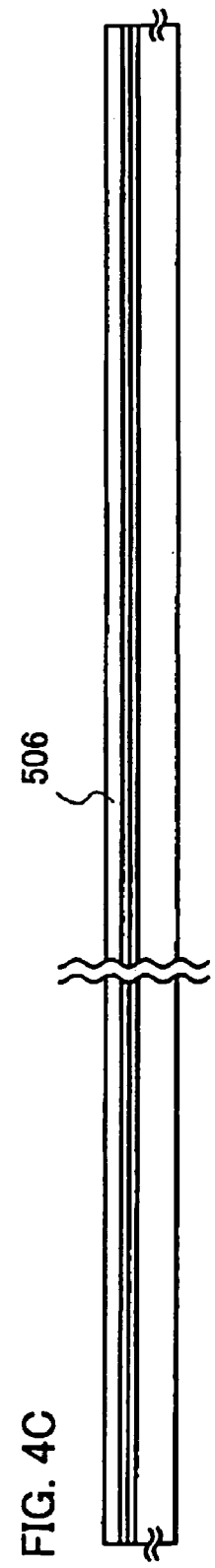

Next, the crystalline semiconductor film 505 is irradiated with a linear laser beam 500 to improve the crystallinity (FIG. 4(B)).

In the case of carrying out laser crystallization, a heat treatment at 500° C. for 1 hour may be given to the crystalline semiconductor film 505 before the laser crystallization in order to enhance the resistance of the crystalline semiconductor film 505 to laser.

For laser crystallization, a continuous wave laser, or a pulsed oscillation laser at an oscillation frequency of 10 MHz or more, preferably 80 MHz or more, as a pseudo CW laser can be used.

Specifically, continuous wave lasers include an Ar laser, a Kr laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, and a helium cadmium laser.

In addition, as the pseudo CW laser, pulsed oscillation lasers such as an Ar laser, a Kr laser, an excimer laser, a $CO_2$ laser, a YAG laser, a $Y_2O_3$ laser, a $YVO_4$ laser, a YLF laser, a $YAlO_3$ laser, a $GdVO_4$ laser, a glass laser, a ruby laser, an alexandrite laser, a Ti:sapphire laser, a copper vapor laser, and a gold vapor laser can be used as long as pulsed oscillation is possible at an oscillation frequency of 10 MHz or more, preferably 80 MHz or more.

These pulsed oscillation lasers eventually exhibit an effect equivalent to the continuous wave laser when the oscillation frequency is increased.

For example, in the case of using a solid laser that is capable of continuous wave oscillation, a crystal of large grain size can be obtained by irradiation with laser light of the second to fourth harmonic. Typically, it is preferable to use the second harmonic (532 nm) or the third harmonic (355 nm) of a YAG laser (fundamental wave: 1064 nm). For example, laser light emitted from a continuous wave YAG laser is converted into a harmonic by a non-linear optical element, and is used to irradiate the semiconductor film 505. The energy density may be made to be approximately 0.01 to 100 MW/cm$^2$ (preferably 0.1 to 10 MW/cm$^2$).

It is to be noted that laser light irradiation may be carried out in an atmosphere including an inert gas such as a rare gas or nitrogen. This makes it possible to suppress roughness of the semiconductor surface due to laser light irradiation and suppress variations in threshold voltage caused by variations in interface state density.

A crystalline semiconductor film 506 with crystallinity more improved is formed by irradiating the semiconductor film 505 described above with a laser beam 500 (FIG. 4(C)).

Figure 4D:
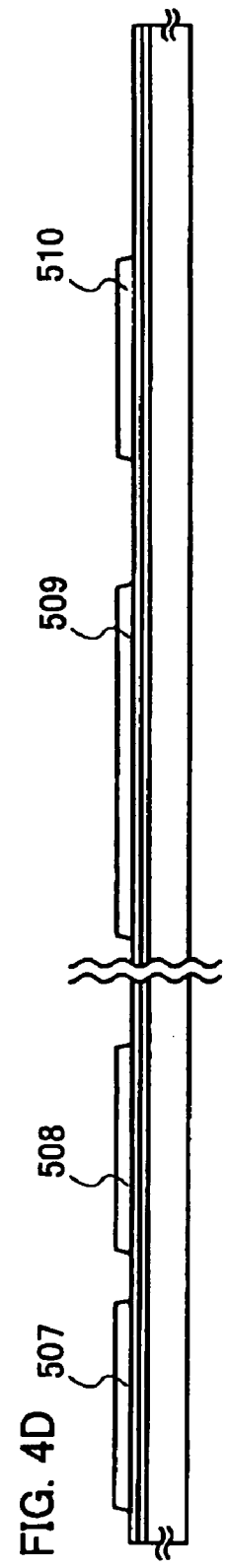

Next, as shown in FIG. 4(D), the crystalline semiconductor film 506 is used to form island-shaped semiconductor films 507 to 510. These island-shaped semiconductor films 507 to 510 serve as active layers of TFTs to be formed in the subsequent process.

Next, an impurity for controlling threshold voltages is introduced into the island-shaped semiconductor films. In the present embodiment, boron (B) is introduced into the island-shaped semiconductor films by doping with diborane (B$_2$H$_6$).

Next, an insulating film 511 is formed to cover the island-shaped semiconductor films 507 to 510. For example, a silicon oxide, a silicon nitride, a silicon oxide containing nitrogen, or the like can be used for the insulating film 511. In addition, plasma CVD, sputtering, or the like can be used as the deposition method.

Next, after forming a conductive film on the insulating film 511, a first conductive film 512 and a second conductive film 513 are formed, and these films are used to form gate electrodes 515 to 519.

The gate electrodes 515 to 519 are formed by using a laminated structure of one or more conductive films. In the case of two or more conductive films laminated, the gate electrodes 515 to 519 may be formed by laminating an element selected from tantalum (Ta), tungsten (W), titanium (Ti), molybdenum (Mo), and aluminum (Al), an alloy material containing the element as its main component, or a compound material. Alternatively, the gate electrodes may be formed by using a semiconductor film typified by a polycrystalline silicon film doped with an impurity element such as phosphorous (P).

In the present embodiment, first as the first conductive film 512, for example, a tantalum nitride (TaN) film is formed to have a film thickness of 10 to 50 nm, for example, 30 nm. Then, as the second conductive film 513, for example, a tungsten (W) film is formed on the first conductive film 512 to have a film thickness of 200 to 400 nm, for example, 370 nm to form a laminated film of the first conductive film 512 and the second conductive film 513 (FIG. 5(A)).

Next, upper gate electrodes 515b to 519b and lower gate electrodes 515a to 519b are formed by continuous anisotropic etching of the second conductive film and the first conductive film and then by isotropic etching of the second conductive film. Thus, the gate electrodes 515 to 519 are formed (FIG. 5(B)).

The gate electrodes 515 to 519 may be formed as part of gate wirings, or gate wirings may be separately formed to connect the gate electrodes 515 to 519 to the gate wirings.

In addition, a portion of the insulating film 511 is also etched during forming the gate electrodes 515 to 519 to form a gate insulating film 514.

Then, with the use of the gate electrodes 515 to 519 or resists as masks, each of the island-shaped semiconductor films 507 to 510 is doped with an impurity that gives one conductivity (n-type or p-type conductivity) to form source regions, drain regions, further lower-concentration impurity regions, and the like.

First, phosphorous (P) is introduced into the island-shaped semiconductor films with the use of phosphine (PH$_3$) at an accelerating voltage of 60 to 120 keV and the dose amount of $1\times10^{13}$ to $1\times10^{15}$ cm$^{-2}$. In this introduction of the impurity, channel forming regions 525, 528, and 531 for n-channel TFTs 542 and 543 are formed.

In addition, in order to manufacture p-channel TFT 541 and 544, boron (B) is introduced into the island-shaped semiconductor films with the use of diborane (B$_2$H$_6$) under the condition that the applied voltage is 60 to 100 keV, for example, 80 keV, and the dose amount is $1\times10^{13}$ to $5\times10^{15}$ cm$^{-2}$, for example, $3\times10^{15}$ cm$^{-2}$. This forms source regions or drain regions 521 and 533 for p-channel TFTs 541 and 544, and channel forming regions 522 and 534 are formed in this introduction of the impurity.

Further, phosphorous (P) is introduced into the island-shaped semiconductor films 508 and 509 to serve as the n-channel TFTs 542 and 543 with the use of phosphine (PH$_3$) at an applied voltage of 40 to 80 keV, for example, 50 keV, and the dose amount of $1.0\times10^{15}$ to $2.5\times10^{16}$ cm$^2$, for example, $3.0\times10^{15}$ cm$^2$. This forms lower-concentration impurity regions 524, 527, and 530 and source regions or drain regions 523, 526, 529, and 532 for the n-channel TFTs (FIG. 5(C)).

In the present embodiment, phosphorous (P) will be included at a concentration of $1\times10^{19}$ to $5\times10^{21}$ cm$^{-3}$ in each of the source regions or drain regions 523, 526, 529, and 532 of the n-channel TFTs 542 and 543. In addition, phosphorous (P) is included at a concentration of $1\times10^{18}$ to $5\times10^{19}$ cm$^{-3}$ in each of the lower-concentration impurity regions 524, 527, and 530 of the n-channel TFTs 542 and 543. Further, boron (B) is included at a concentration of $1\times10^{19}$ to $5\times10^{21}$ cm$^{-3}$ in the source regions or drain regions 521 and 533 of the p-channel TFTs 541 and 544.

Next, a first interlayer insulating film 551 is formed to cover the island-shaped semiconductor films 507 to 510, the gate insulating film 514, and the gate electrodes 515 to 519.

As the first interlayer insulating film 551, an insulating film including silicon, for example, a silicon oxide film, a silicon nitride film, a silicon oxide film containing nitrogen, or a laminated film thereof, is formed by plasma CVD or sputtering. Of course, the first interlayer insulating film 551 is not to be considered limited to the silicon oxide film containing nitrogen, the silicon nitride film, or the laminated film there of, and another insulating film including silicon may be used as a single layer or a laminated structure.

In the present embodiment, after introducing the impurities, a silicon oxide film containing nitrogen is formed by plasma CVD to be 50 nm, and the impurities are activated by a laser irradiation method or heating at 550° C. in a nitrogen atmosphere for 4 hours after forming a silicon oxide film including nitrogen.

Next, a silicon nitride film is formed by plasma CVD to be 50 nm, and a silicon oxide film containing nitrogen is further formed to be 600 nm. This laminated film of the silicon oxide film containing nitrogen, the silicon nitride film, and the silicon oxide film containing nitrogen is the first interlayer insulating film 551.

Next, hydrogenation is carried out by heating the whole at 410° C. for 1 hour to release hydrogen from the silicon nitride film.

Figure 6A:
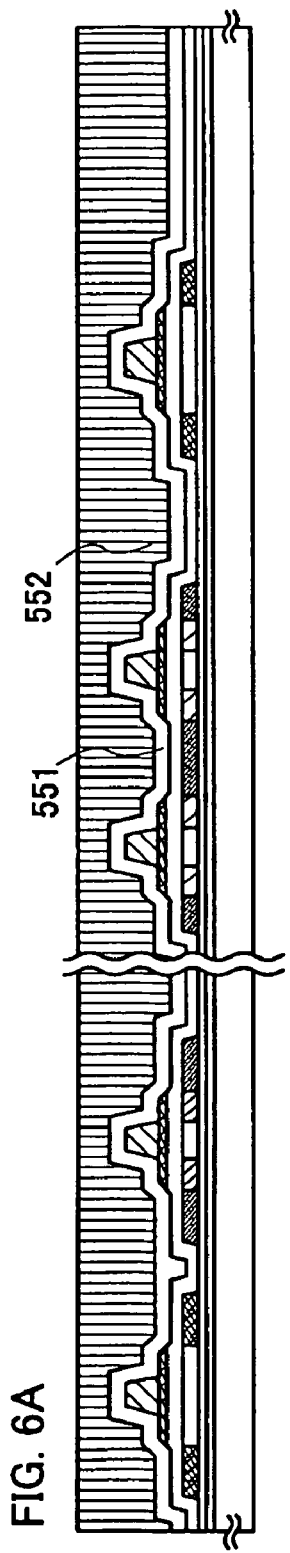
FIG. 6 illustrates the manufacturing process of the semiconductor device according to the present invention.

Next, a second interlayer insulating film 552 that acts as a planarization film is formed to cover the first interlayer insulating film 551 (FIG. 6(A)).

As the second interlayer insulating film 552, a photosensitive or non-photosensitive organic material (a polyimide, an acrylic, a polyamide, a polyimideamide, a resist, or a benzocyclobutene), a siloxane, and a laminated structure thereof can be used. As the organic material, a positive photosensitive organic resin or a negative photosensitive organic resin can be used.

A siloxane has a skeleton structure formed by bonding silicon (Si) and (O), where an organic group including at least hydrogen (for example, an alkyl group or an aromatic hydrocarbon) is used as a substituent. A fluoro group may be used as a substituent. Alternatively, an organic group including at least hydrogen and a fluoro group may be used as substituents.

In the present embodiment, a siloxane is formed by spin coating as the second interlayer insulating film 552.

Further, a third interlayer insulating film may be formed on the second interlayer insulating film 552. As the third interlayer insulating film, a film through which moisture, oxygen, or the like is hardly transported as compared with other insulating films is used. Typically, a silicon nitride film, a silicon oxide film, a silicon nitride film containing oxygen (composition ratio: N>O), or a silicon oxide film containing nitrogen (composition ratio: N<O) that is obtained by sputtering or CVD, a thin film including carbon as its main component (for example, a diamond-like carbon film (a DLC film) or a carbon nitride film (a CN film)), and the like can be used.

Figure 6B:
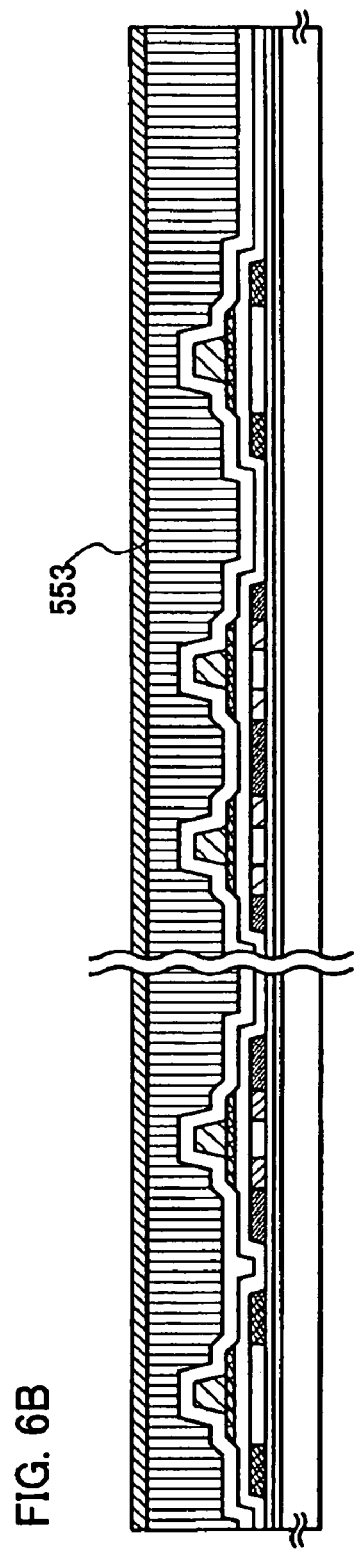

Next, a transparent conductive film 553 is formed over the second interlayer insulating film 552 (FIG. 6(B)). As the transparent conductive film to be used in the present invention, an indium tin oxide alloy containing silicon (Si) (also referred to as an indium tin oxide containing Si) is used. Besides the indium tin oxide alloy containing Si, transparent conductive films such as a zinc oxide (ZnO), a tin oxide ($SnO_2$), an indium oxide, and an indium oxide-zinc oxide (IZO) alloy of indium oxide (InO) mixed with 2 to 20 atomic % zinc oxide (ZnO) may be used. In the present embodiment, as the transparent conductive film 553, an indium tin oxide alloy containing Si is deposited by sputtering to have a thickness of 110 nm.

Figure 6C:
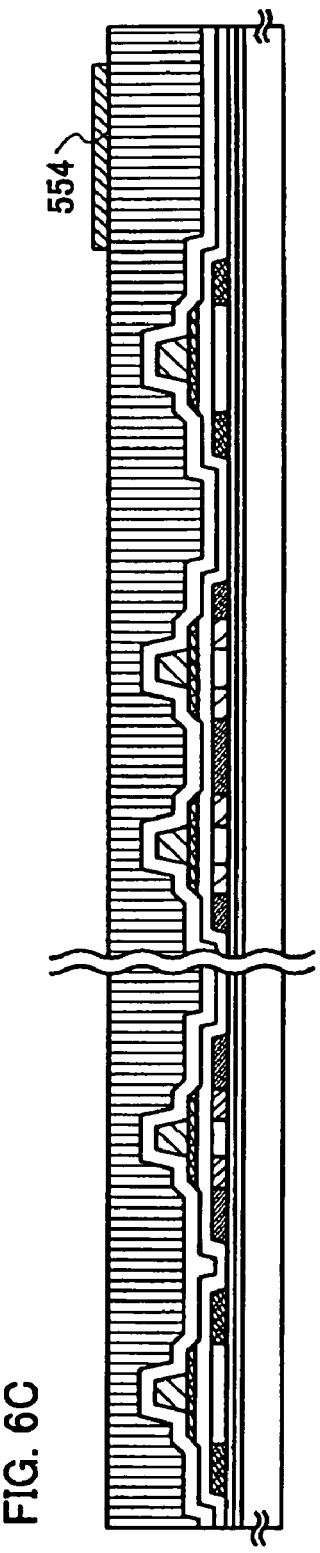

Next, a pixel electrode 554 is formed with the use of the transparent conductive film 553 (FIG. 6(C)). For forming the pixel electrode 554, the transparent conductive film 553 may be etched by wet etching.

Figure 7A:
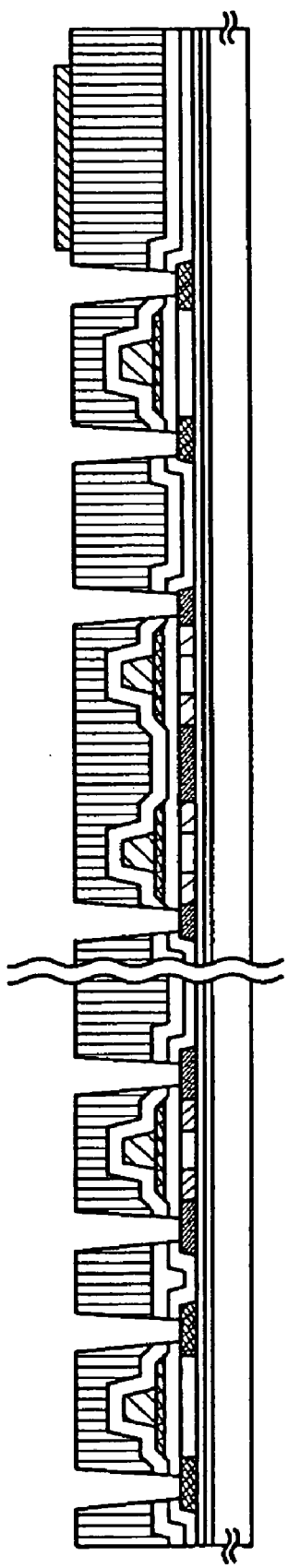
FIG. 7 illustrates the manufacturing process of the semiconductor device according to the present invention.

The first interlayer insulating film 551 and the second interlayer insulating film 552 are etched to form contact holes reaching to the island-shaped semiconductor films 507 to 510 in the first interlayer insulating film 551 and the second interlayer insulating film 552 (FIG. 7(A)).

Figure 7B:
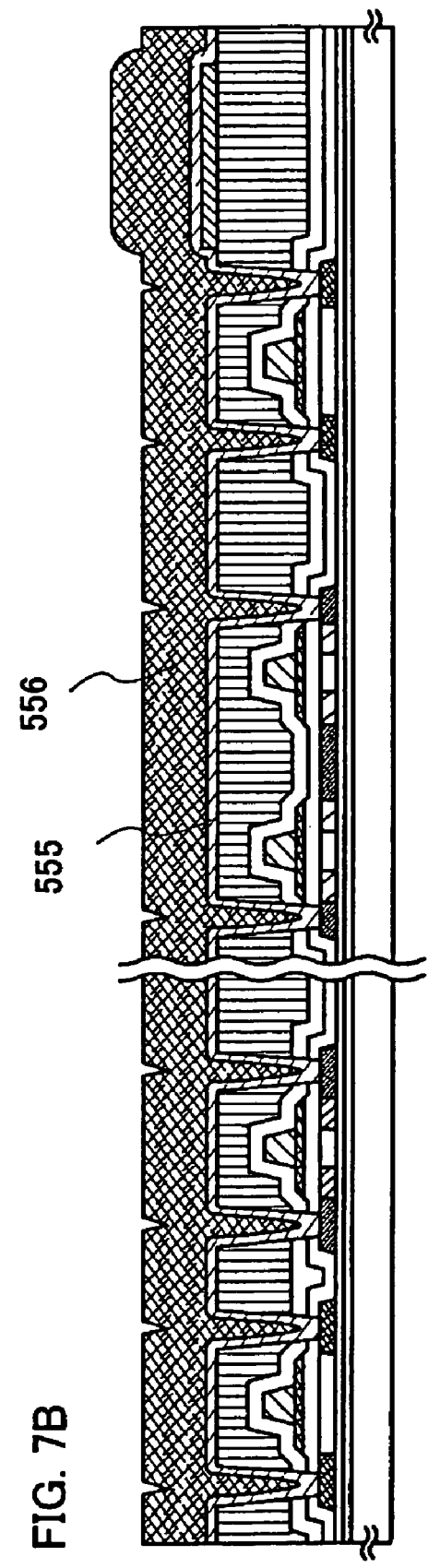

A third conductive film 555 and a fourth conductive film 556 are formed through the contact holes over the second interlayer insulating film 551 (FIG. 7(B)).

As the present embodiment, a film of molybdenum (Mo), tungsten (W), tantalum (Ta), or chromium (Cr), or an alloy film using these elements may be used for the third conductive film 555. In the present embodiment, molybdenum (Mo) is deposited by sputtering to be 100 nm.

In addition, a film including aluminum as its main component is formed by sputtering for the fourth conductive film 556. For the film including aluminum as its main component, an aluminum film, an aluminum alloy film including at least one element of nickel, cobalt, and iron, an aluminum alloy film including at least one element of nickel, cobalt, and iron and including carbon (C) can be used. In the present embodiment, an aluminum film is formed by sputtering to be 700 nm.

Next, the fourth conductive film 556 is etched to form electrodes 561b to 567b (FIG. 8(A)).

For etching of the fourth conductive film 556, dry etching is carried out by using a mixed gas of $BCl_3$ and $Cl_2$. In the present embodiment, dry etching is carried out by flowing $BCl_3$ and $Cl_2$ respectively at flow rates of 60 sccm and 20 sccm.

At this stage, the third conductive film 555 serves as an etching stopper, and the pixel electrode 554 has no contact with the mixed gas of $BCl_3$ and $Cl_2$. Therefore, particles can be prevented from being produced.

Next, etching of the third conductive film 555 is carried out to form electrodes 561a to 567a. In the present embodiment, etching of the third conductive film 555 is carried out by flowing $CF_4$ and $O_2$ respectively at flow rates of 30 to 60 sccm and 40 to 70 sccm.

At this stage, since the pixel electrode 554 does not react with $CF_4$ or $O_2$, fine particles are not formed. In addition, the pixel electrode 554 serves as an etching stopper for etching the third conductive film 555 to form the electrode 567a.

Thus, the electrodes 561 to 567 are formed. For each of the electrodes 561 to 567, an electrode and a wiring may be formed by using the same material in the same process, or an electrode and a wiring may be formed separately and connected to each other.

In accordance with the series of processes described above, the n-channel TFTs 542 and 543 and the p-channel TFTs 541 and 544 are formed. The n-channel TFT 542 and the p-channel TFT 541 are connected by the electrode 562 to form a CMOS circuit 571 (FIG. 8(B)).

In addition, the present embodiment can be freely combined with any descriptions of Embodiment Mode and Embodiment 1, if necessary.

Embodiment 3

In the present embodiment, an example of manufacturing a both-emission display device using the present invention will be shown with reference to FIGS. 9(A) and 9(B), FIG. 10, FIG. 11, and FIG. 21.

First, the steps up to the formation of the electrodes 561 to 567 in FIG. 8(B) are carried out in accordance with Embodiment 2. It is to be noted that the same elements as those in Embodiment 2 are denoted by the same numerals.

In the present embodiment, a driving circuit portion 595 and a pixel portion 596 are provided over the substrate 501, and the CMOS circuit 571 composed of the n-channel TFT 542 and the p-channel TFT 541 is formed in the driving circuit portion 595. In addition, the p-channel TFT 544 that serves as a pixel TFT and the n-channel TFT 543 that drives the pixel TFT are formed in the pixel portion 596. In addition, the pixel electrode 554 serves as an anode of a light-emitting element in the present embodiment.

After forming the electrodes 561 and 562, an insulator 581 (referred to as a partition, a barrier, or the like) covering an edge of the pixel electrode 554 is formed. As the insulator 581, a photosensitive or non-photosensitive organic material (a polyimide, an acrylic, a polyamide, a polyimideamide, a resist, or a benzocyclobutene) or an SOG film (for example, a silicon oxide film including an alkyl group) that can be obtained by a coating method is used in the range of 0.8 to 1 μm in film thickness (FIG. 9(A)).

For the insulator 581, a silicon oxide, a silicon nitride, a silicon oxide containing nitrogen, an aluminum oxide, an aluminum nitride, an aluminum oxynitride, and other inorganic insulating materials may be used. Alternatively, an acrylic acid, a methacrylic acid, and derivatives of these, or a heat-resistant polymer such as a polyimide, an aromatic polyamide, or a polybenzimidazole can be used as the insulator 581. Further, as the insulator 581, an insulating material using a siloxane can be formed. It is preferable that the insulator 581 have a shape with a curvature radius continuously varying, and in this case, the coverage of an organic compound layer 582 and a second electrode 583 that are to be formed thereon is improved.

A siloxane has a skeleton structure formed by bonding silicon (Si) and (O), where an organic group including at least hydrogen (for example, an alkyl group or an aromatic hydrocarbon) is used as a substituent. A fluoro group may be used as a substituent. Alternatively, an organic group including at least hydrogen and a fluoro group may be used as substituents.

After forming the insulator 581, the organic compound layer 582 is formed. The second electrode 583, that is, a cathode of the light-emitting element is then formed in the range of 10 to 800 nm in film thickness (FIG. 9(B)). As the second electrode 583, in addition to an indium tin oxide alloy (ITO), for example, an indium tin oxide alloy containing an element Si and an indium oxide-zinc oxide (Indium Zinc Oxide) of indium oxide mixed with 2 to 20 atomic % zinc oxide (ZnO) can be used.

The organic compound layer 583 has a hole injecting layer 601, a hole transporting layer 602, a light-emitting layer 603, an electron transporting layer 604, and an electron injecting layer 605 that are formed by an evaporation method or a coating method. It is to be noted that, in order to improve the reliability of the light-emitting element, it is preferable that vacuum heating is carried out for degassing before forming the organic compound layer 582. For example, before carrying out deposition of an organic compound material, it is preferable that a heat treatment at 200 to 300° C. be carried out in a reduced-pressure atmosphere or an inert atmosphere in order to remove gas contained in the substrate. It is to be noted that a higher-heat treatment (410° C.) can also be given when the interlayer insulating film and the insulator are formed by using high heat-resistant SiOx films.

Next, a molybdenum oxide (MoOx), 4,4'-bis[N-(1-naphthyl)-N-phenyl-amino]-biphenyl (α-NPD), and rubrene are selectively co-deposited on the pixel electrode 554 with the use of a deposition mask to form the hole injecting layer 601.

Further, in addition to MoOx, highly hole injecting materials such as copper phthalocyanine (CuPc), a vanadium oxide (VOx), a ruthenium oxide (RuOx), and a tungsten oxide (WOx) can be used. In addition, a highly hole injecting polymer material such as a polyethylene dioxythiophene solution (PEDOT) or a polystyrene sulphonate solution (PSS) may be formed by a coating method to be used as the hole injecting layer 601.

Then, α-NPD is selectively deposited with the use of a deposition mask to form the hole transporting layer 602 on the hole injecting layer 601. Further, in addition to α-NPD, highly hole transporting materials typified by aromatic amine compounds such as 4,4'-bis[N-(3-methylphenyl)-N-phenyl-amino]-biphenyl (abbreviation: TPD), 4,4',4''-tris (N,N-diphenyl-amino)-triphenylamine (abbreviation: TDATA), and 4,4',4''-tris [N-(3-methylphenyl)-N-phenyl-amino]-triphenylamine (abbreviation: MTDATA) can be used.

Then, the light-emitting layer 603 is selectively formed. For full-color display, a deposition mask is aligned for each luminescent color (R, Q and B) to deposit each selectively.

Then, $Alq_3$ (tris (8-quinolinolato) aluminum) is selectively deposited with the use of a deposition mask to form the electron transporting layer 604 on the light-emitting layer 603. Further, in addition to $Alq_3$, highly electron transporting materials typified by a metal complex having a quinoline skeleton or a benzoquinoline skeleton, such as tris (5-methyl-8-quinolinolato) aluminum (abbreviation: $Almq_3$), bis (10-hydroxybenzo[h]-quinolinato) beryllium (abbreviation: $BeBq_2$), and bis(2-methyl-8-quinolinolato)-4-phenylphenolato-aluminum (abbreviation: BAlq), and the like can be used. In addition, metal complexes having an oxazole-based or thiazole-based ligand, such as bis[2-(2-hydroxyphenyl)-benzoxazolato] zinc (abbreviation: $Zn(BOX)_2$) and bis[2-(2-hydroxyphenyl)-benzothiazolato] zinc (abbreviation: $Zn(BTZ)_2$), and the like can be also used. Further, besides the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazole-2-yl] benzene (abbreviation: OXD-7), 3-(4-tert-butylphenyl)-4-phenyl-5-(4-biphenylyl)-1,2,4-triazole (abbreviation: TAZ),3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproine (abbreviation: BCP), and the like also have high electron transporting properties, and can be therefore used as the electron transporting layer 604.

Then, 4,4-bis(5-methylbenzoxazole-2-yl) stilbene (abbreviation: BzOs) and lithium (Li) are co-deposited to form the electron injecting layer 605 over the entire surface covering the electron transporting layer 604 and insulator 581. A damage due to sputtering in formation of the second electrode 583 to be carried out in a subsequent process is suppressed by using the benzoxazole derivative (BzOs). Further, besides BzOs:Li, highly electron injecting materials such as a compound of an alkali metal or an alkali-earth metal, that is, $CaF_2$, lithium fluoride (LiF), cesium fluoride (CsF), or the like, can be used. In addition, a mixture of $Alq_3$ and magnesium (Mg) can be also used.

Next, the second electrode 583, that is, the cathode of the organic light-emitting element is formed on the electron injecting layer 605 in the range of 10 to 800 nm in film thickness. As the second electrode 583, in addition to an indium tin oxide alloy (ITO), for example, an indium tin oxide alloy containing Si and an IZO (Indium Zinc Oxide) of indium oxide mixed with 2 to 20 atomic % zinc oxide (ZnO) can be used.

It is to be noted that a transparent electrode is used for the second electrode 583 since the example of manufacturing the both-emission display device is described in the present embodiment. However, a reflective conductive material may be used to form the second electrode 583 in the case of manufacturing a one-side emission display device. It is preferable to use a metal, an alloy, an electrically conducting compound, a mixture of these, and the like that are small in work function (a work function of 3.8 eV or less) as this conductive material. Further, specific examples of the material for the second electrode 583 include elements that belong to Group 1 or 2 of the periodic table of the elements, that is, alkali metals such as Li and Cs and alkali-earth metals such as Mg, Ca, and Sr, and alloys (Mg:Ag and Al:Li) and compounds (LiF, CsF, and $CaF_2$) including these elements, and in addition, transition metals including rare-earth metals can be used to form the second electrode 583. However, the second electrode 583 can be also formed by using a lamination layer of the material and a metal (including an alloy) such as Al or Ag.

Thus, a light-emitting element 584 is manufactured. Respective materials for the anode 554, the organic compound layer 582, and the cathode 583 constituting the light-emitting element 584 are appropriately selected, and the respective film thicknesses are also adjusted. It is preferable that the same material be used for the anode and the cathode and that the anode and the cathode have a comparable thickness, preferably a thin film thickness of approximately 100 nm.

Figure 10:
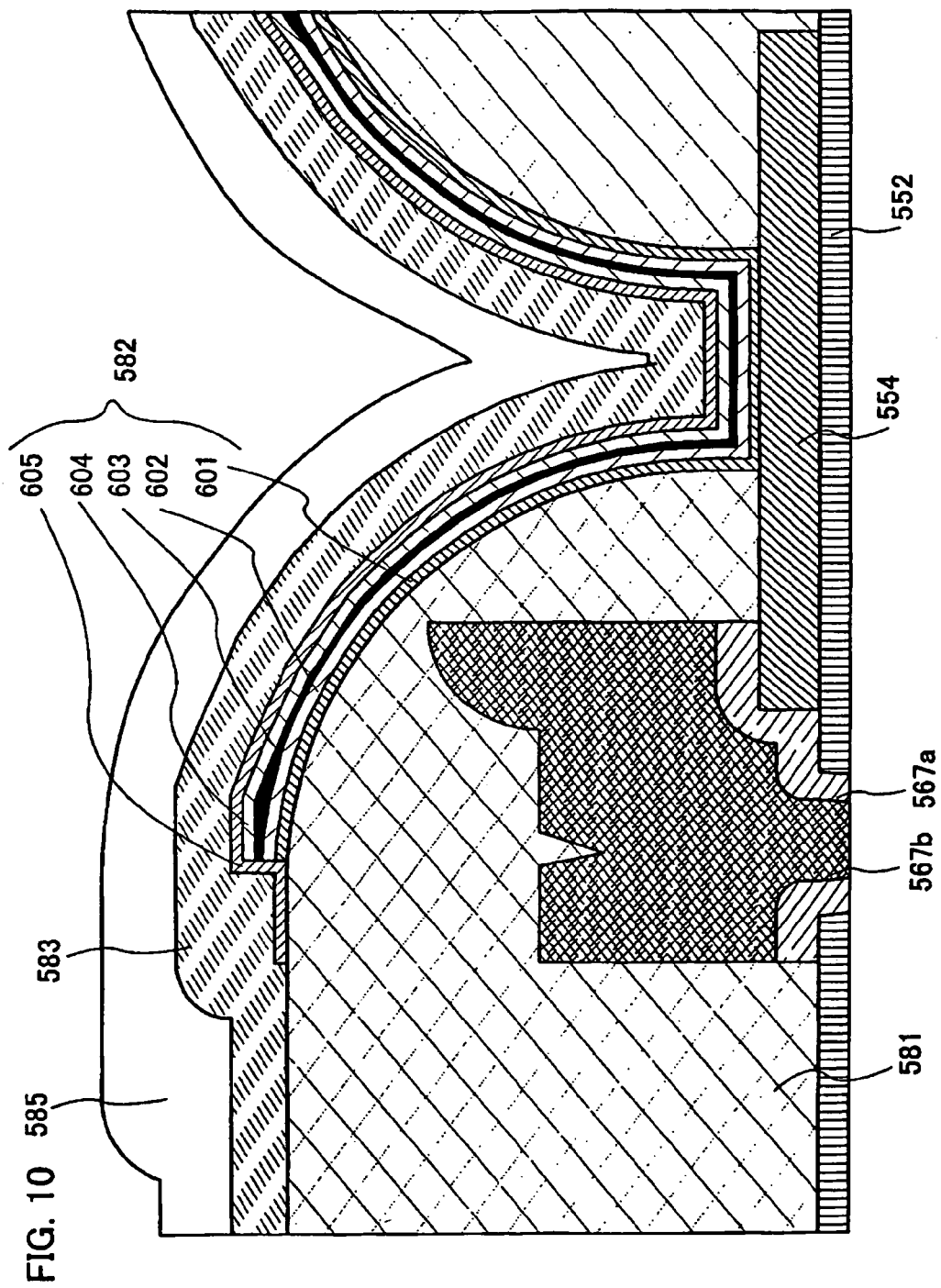
FIG. 10 illustrates the manufacturing process of the display device according to the present invention.

In addition, if necessary, a transparent protective film 585 that prevents penetration of moisture is formed to cover the light-emitting element 584 as shown in FIG. 9(B). As the transparent conductive film 585, a silicon nitride film, a silicon oxide film, a silicon nitride film containing oxygen (composition ratio: N>O), or a silicon oxide film containing nitrogen (composition ratio: N<O) that is obtained by sputtering or CVD, a thin film including carbon as its main component (for example, a diamond-like carbon film (a DLC film) or a carbon nitride film (a CN film)), and the like can be used. It is to be noted that FIG. 10 shows an enlarged view of a portion of FIG. 9(B).

Figure 21:
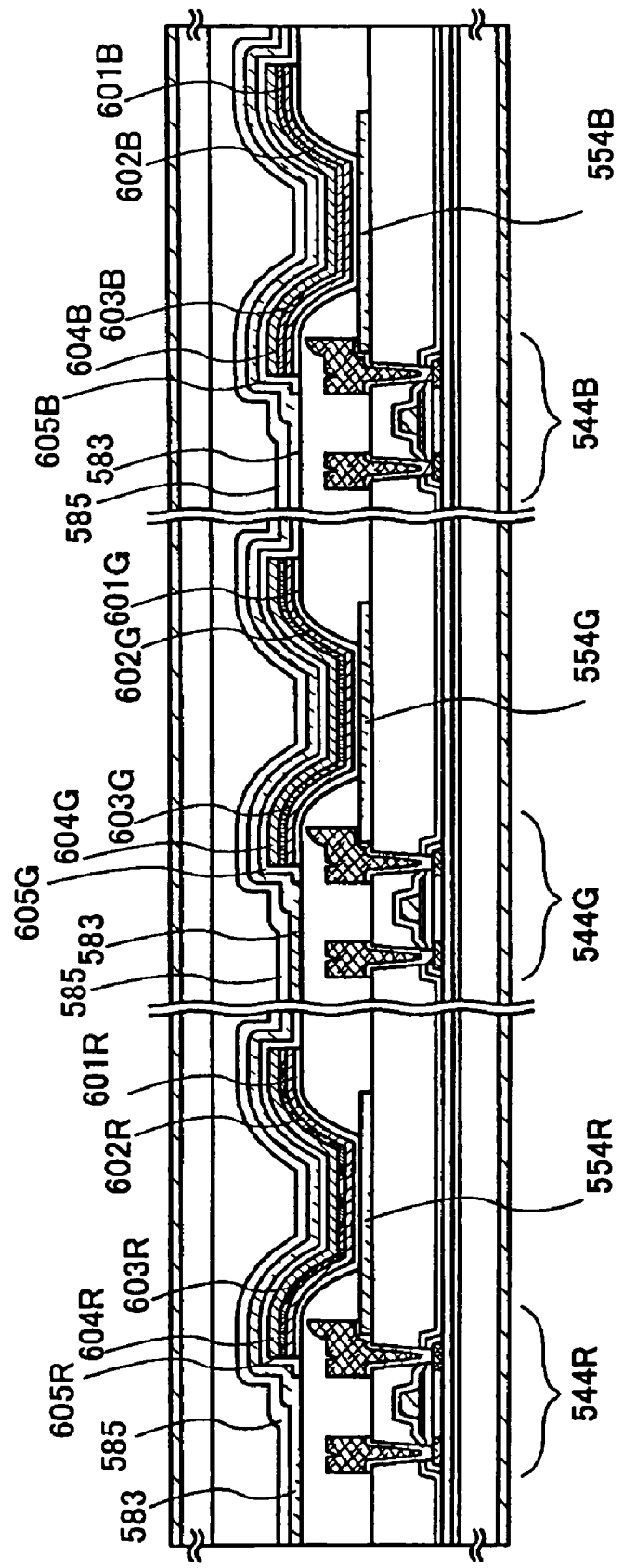
FIG. 21 illustrates a manufacturing process of a display device according to the present invention.

In addition, FIG. 21 shows an example where pixel TFTs in a pixel portion are differently formed for RGB. In a pixel for red (R), a pixel TFT 544R is connected to a pixel electrode 544R, and a hole injecting layer 601R, a hole transporting layer 602R, a light-emitting layer 603R, an electron transporting layer 604R, an electron injecting layer 605R, a cathode 583, and a transparent protective film 585 are formed.

Further, in a pixel for green (G), a pixel TFT 544G is connected to a pixel electrode 544G, and a hole injecting layer 601G, a hole transporting layer 602G, a light-emitting layer 603G, an electron transporting layer 604G, an electron injecting layer 605G, the cathode 583, and the transparent protective film 585 are formed.

Furthermore, in a pixel for blue (B), a pixel TFT 544B is connected to a pixel electrode 544B, and a hole injecting layer 601B, a hole transporting layer 602B, a light-emitting layer 603B, an electron transporting layer 604B, an electron injecting layer 605B, the cathode 583, and the transparent protective film 585 are formed.

As the light-emitting layer 603R that produces red luminescence, a material such as $Alq_3$:DCM or $Alq_3$:rubrene: BisDCJTM is used. In addition, a material such as $Alq_3$: DMQD (N,N'-dimethylquinacridone) or $Alq_3$:coumarine 6 is used as the light-emitting layer 603G that produces green luminescence. In addition, a material such as α-NPD or tBu-DNA is used as the light-emitting layer 603B that produces blue luminescence.

Next, a sealing material 593 containing a gap material for ensuring a substrate spacing is provided over the driving circuit portion 595 including the CMOS circuit 571, and a second substrate 591 is attached to the substrate 501. Also for the second substrate 591, a light-transmitting glass substrate or a quartz substrate may be used. It is to be noted that a drying agent may be disposed as an air gap (an inert gas) in a region 592 of the space between the substrates 501 and 591, below which the pixel portion 596 is provided, or the region 592 may be filled with a transparent sealing material (such as an ultraviolet-curing or thermosetting epoxy resin).

Since the pixel electrode 554 and the second electrode 583 of the light-emitting element are formed by using light-transmitting materials, light can be extracted from two directions of one light-emitting element, that is, from the both sides.

With the panel structure described above, light emission from the upper surface can be made substantially equal to light emission from the lower surface.

Figure 11:
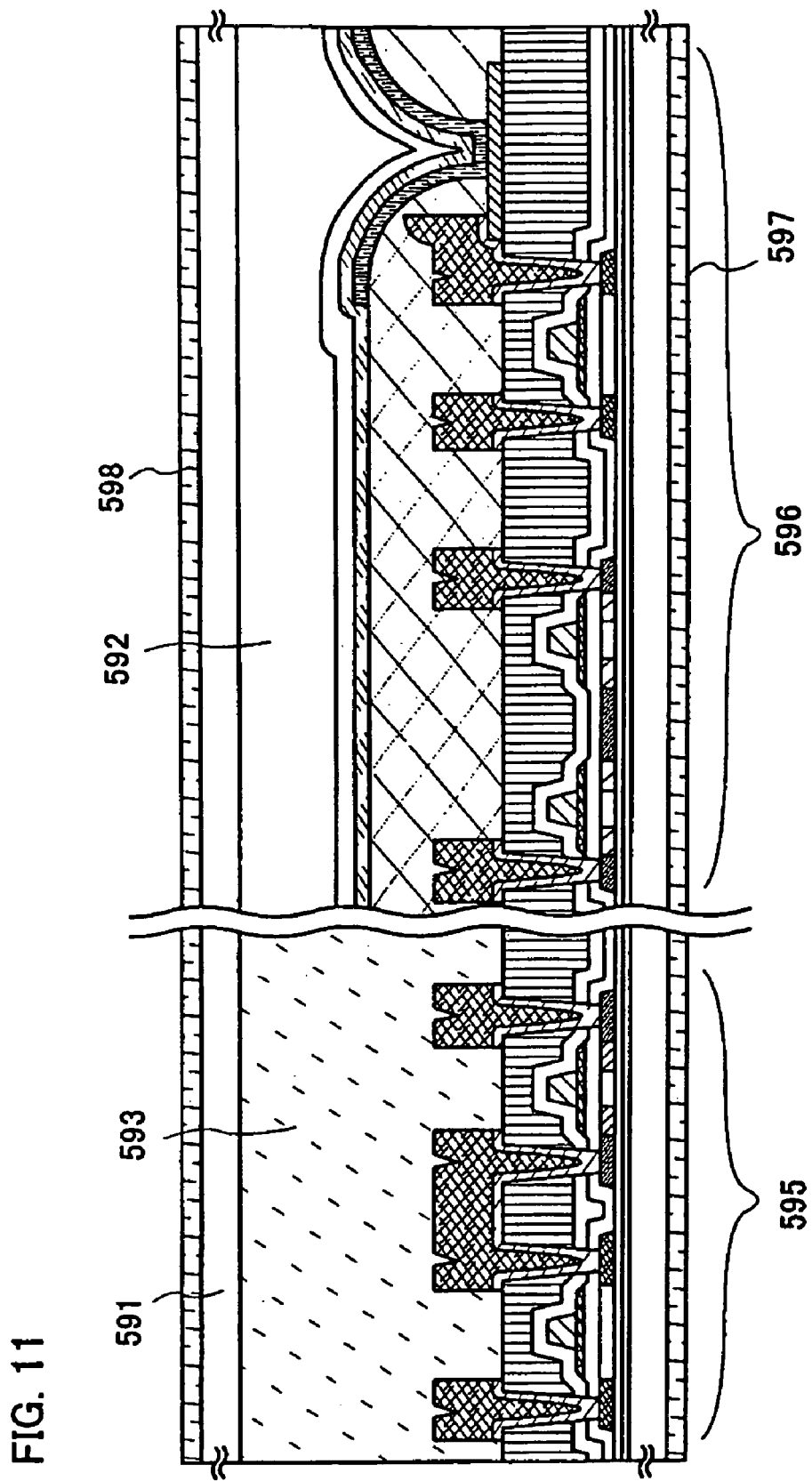
FIG. 11 illustrates the manufacturing process of the display device according to the present invention.

Further, optical films (polarizing plates or circularly polarizing plates) 597 and 598 are preferably provided on each of the substrates 501 and 591 to improve the contrast (FIG. 11).

Although the TFTs are made to be top-gate TFTs in the present embodiment, the structures thereof are not to be considered limited to the structures. A bottom-gate (inversely staggered) TFT or a staggered TFT can be appropriately used. In addition, the TFTs are not limited to a single-gate TFT, and may be a multi-gate TFT that has a plurality of channel forming regions, for example, a double-gate TFT.

In the display device according to the present embodiment, since fine particles are not produced during the formation of the pixel electrode 554, and the electrodes 561 to 567 a short circuit between the pixel electrode 554 and other conductive film can be prevented. This enables a favorable display device with high reliability to be manufactured.

The display device with the light-emitting element is described in the present embodiment. However, a liquid crystal display device (Liquid Crystal Display (LCD)) can also be manufactured in accordance with a similar manufacturing process. For this LCD, a pixel portion and a driving circuit portion may be formed by using the TFTs shown in Embodiment 2 in accordance with the present embodiment.

In addition, the present embodiment can be freely combined with any descriptions of Embodiment Mode and Embodiments 1 and 2, if necessary.

Embodiment 4

Electronic devices to which the present invention is applied include a video camera, a digital camera, a goggle-type display, a navigation system, a sound reproduction system (such as an in-car audio system), a computer, a game machine, a personal digital assistant (such as a mobile computer, a cellular phone, a portable game machine, or an electronic book), and an image reproduction system provided with a recording medium (specifically, a system provided with a display that can reproduce a recording medium such as a Digital Versatile Disc (DVD) and display the image). FIG. 12, FIG. 13, FIGS. 14(A) and 14(B), FIGS. 15(A) and 15(B), FIG. 16, and FIGS. 17(A) to 17(E) show specific examples of those electronic devices.

Figure 12:
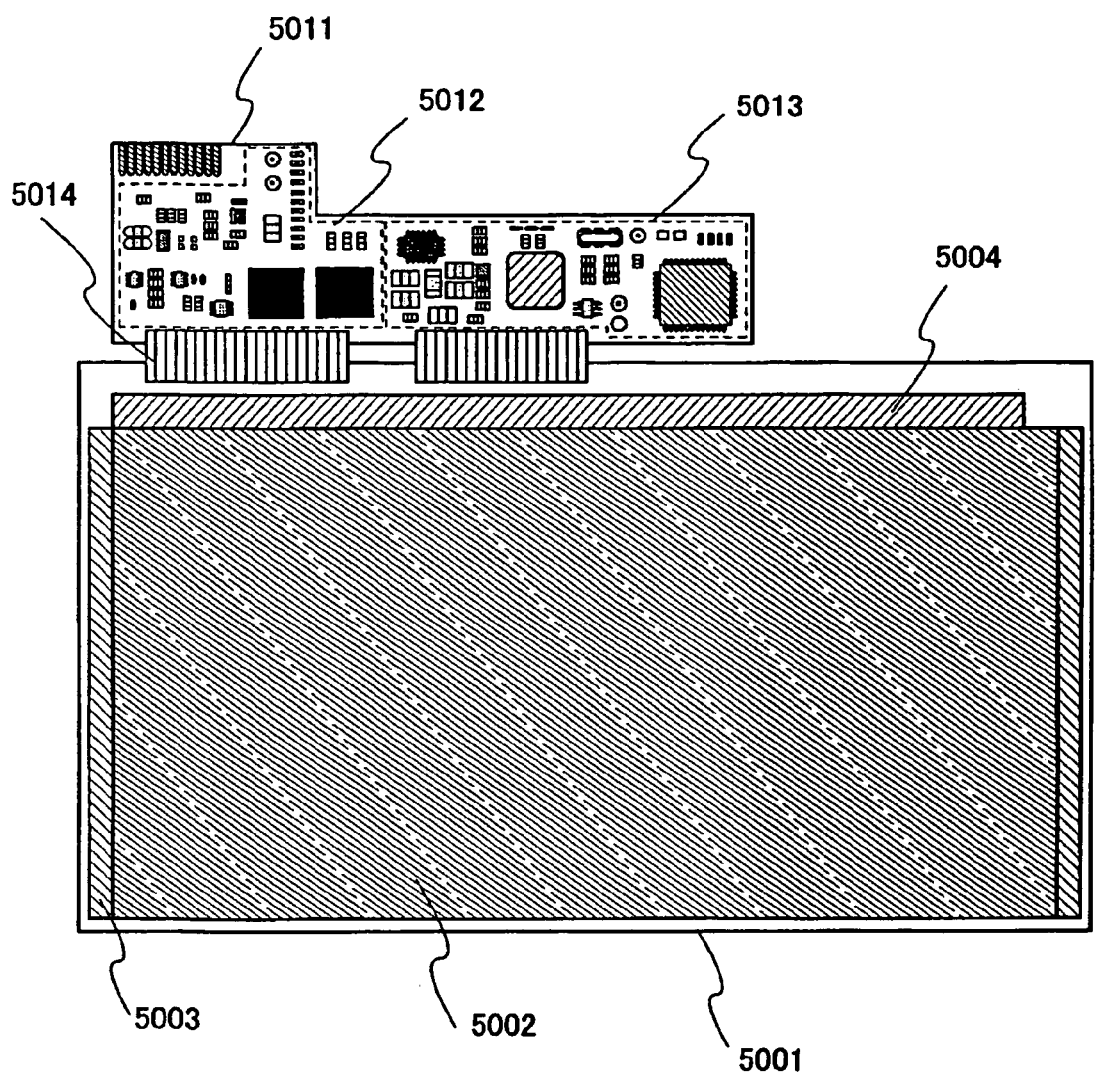
FIG. 12 illustrates an example of electronic devices to which the present invention is applied.

FIG. 12 shows an EL module in which a display panel 5001 and a circuit substrate 5011 are combined. The circuit substrate 5011 has a control circuit 5012, a signal dividing circuit 5013, and the like formed, and is electrically connected to the display panel 5001 by a connection wiring 5014.

This display panel 5001 is provided with a pixel portion 5002 that has a plurality of pixels provided, a scan line driving circuit 5003, and a signal line driving circuit 5004 that supplies a video signal to a selected pixel. The display panel 5001 of the EL module may be manufactured by using the method for manufacturing a display device, which is described in Embodiment 3.

Figure 13:
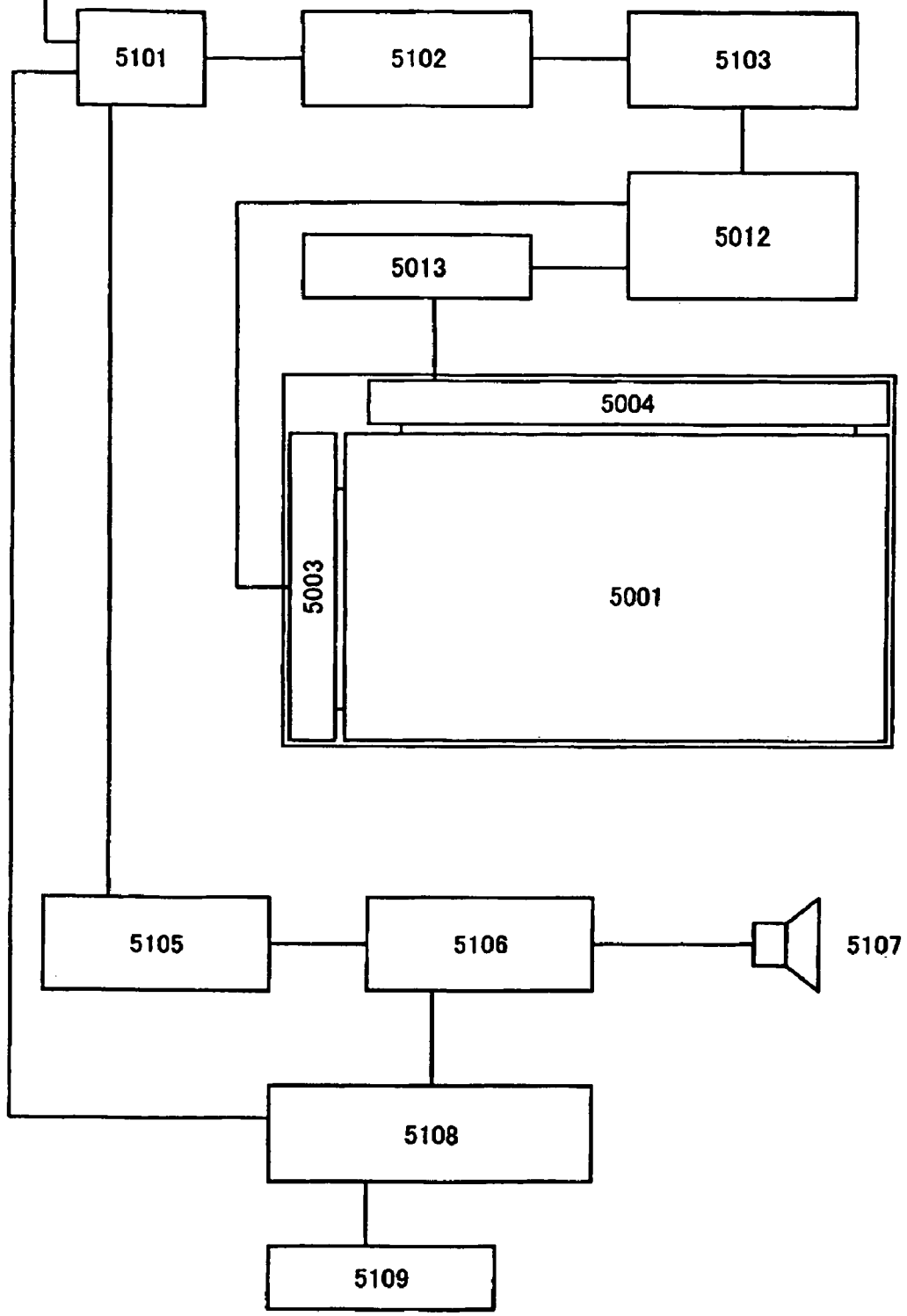
FIG. 13 illustrates an example of electronic devices to which the present invention is applied.

The EL module shown in FIG. 12 makes it possible to complete a television receiver. FIG. 13 is a block diagram showing major components of a receiver. A tuner 5101 receives image signals and sound signals. The image signals are processed by an image signal amplifier circuit 5102, an image signal processing circuit 5103 that converts signals output from the image signal amplifier circuit 5102 into color signals corresponding to respective colors of red, green, and blue, and a control circuit 5012 for converting the image signals into an input specification of a driver IC. The control circuit 5012 outputs signals to each of the scan line side and the signal line side. In the case of digital driving, the signal dividing circuit 5013 may be provided on the signal line side to divide an input digital signal into m signals and supply the m signals.

The sound signals of the signals received by the tuner 5101 are transmitted to a sound signal amplifier circuit 5105, and the output thereof is supplied through a sound signal processing circuit 5106 to a speaker 5107. A control circuit 5108 receives control information of a receiving station (received frequency) and a sound volume from an input portion 5109, and passes signals to the tuner 5101 and the sound signal processing circuit 5106.

Figure 14A:
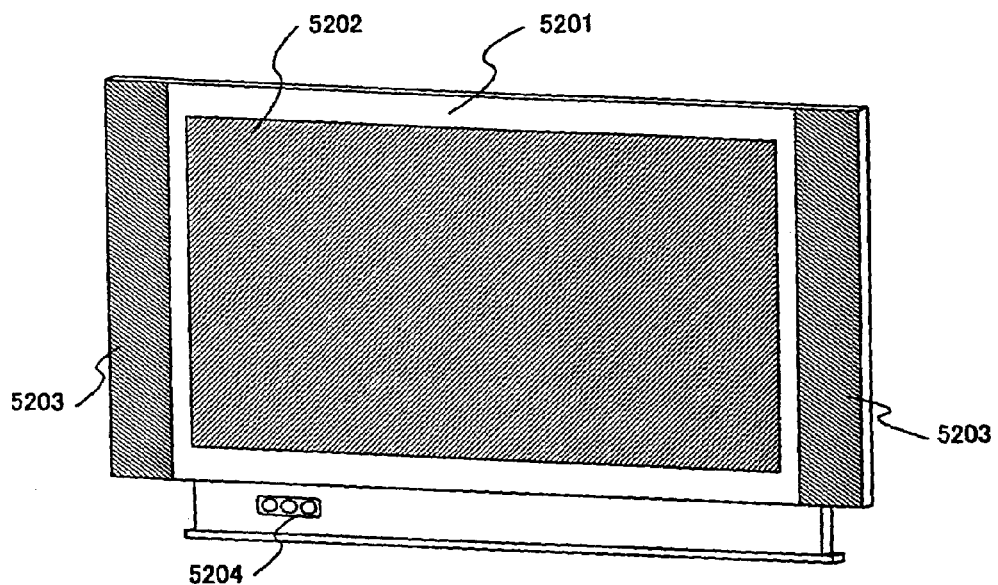
FIG. 14 illustrates examples of electronic devices to which the present invention is applied.

As shown in FIG. 14(A), a television receiver can be completed by incorporating the EL module in a housing 5201. The EL module forms a display screen 5202. In addition, a speaker 5203, an operation switch 5204, and the like are appropriately provided.

Figure 14B:
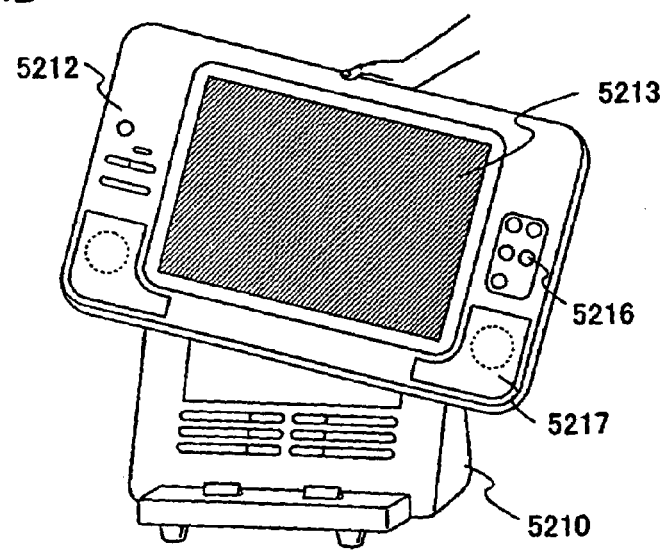

Further, FIG. 14(B) shows a television receiver of which only a display is portable wirelessly. A battery and a signal receiver are incorporated in a housing 5212, and a display portion 5213 and a speaker portion 5217 are driven by the battery. The battery can be recharged repeatedly by a recharger 5210. Further, the recharger 5210 is able to transmit and receive image signals, and transmit the image signals to the signal receiver of the display. The housing 5212 is controlled with an operation key 5216. In addition, the device shown in FIG. 14(B) can be also referred to as image sound two-way communication device since signals can be transmitted also from the housing 5212 to the rechrager 5210 by operating the operation key 5216, or can be referred to as a general-purpose remote-control device since signals can be transmitted from the housing 5212 to the rechrager 5210 by operating the operation key 5216 and further, communication control of another electronic device is also possible by making the electronic device receive signals that can be transmitted by the rechrager 5210. The present invention can be applied to the display portion 5213, the circuit portion for control, and the like.

By using the present invention for the television receivers shown in FIGS. 12, 13, 14(A) and 14(B), favorable television receivers with high reliability can be obtained.

Of course, the present invention is not limited to the television receivers, and can be applied to various uses such as monitors of personal computers, information display panels in train stations, airports, and the like, and advertising display panels on the streets, particularly as large-area display mediums.

Figure 15A:
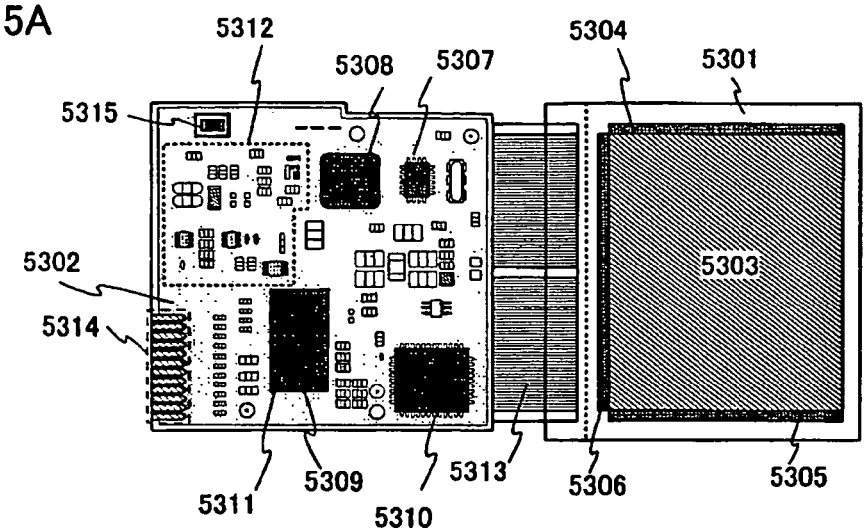
FIG. 15 illustrates an example of electronic devices to which the present invention is applied.

FIG. 15(A) illustrates a module of a display panel 5301 combined with a printed wiring board 5302. The display panel 5301 is provided with a pixel portion 5303 with a plurality of pixels provided, a first scan line driving circuit 5304, a second scan line driving circuit 5305, and a signal line driving circuit 5306 that supplies a video signal to a selected pixel.

The printed wiring board 5302 is provided with a controller 5307, a central processing unit (CPU) 5308, a memory 5309, a power supply circuit 5310, a sound processing circuit 5311, a transmit-receive circuit 5312, and the like. The printed wiring board 5302 and the display panel 5301 are connected by a flexible printed circuit (FPC) 5313. The printed wiring board 5302 may be provided with a capacitative element, a buffer circuit, and the like so that noise on a power supply voltage or a signal and slow rising of a signal are prevented. Alternatively, the controller 5307, the sound processing circuit 5311, the memory 5309, the CPU 5308, the power supply circuit 5310, and the like can be mounted on the display panel 5301 by using a COG (Chip On Glass) method. The COG method makes it possible to reduce the size of the printed wiring board 5302.

Various control signals are input and output through an interface portion 5314 provided on the printed wiring board 5302. In addition, an antenna port 5315 for transmitting and receiving signals to and from an antenna is provided on the printed wiring board 5302.

Figure 15B:
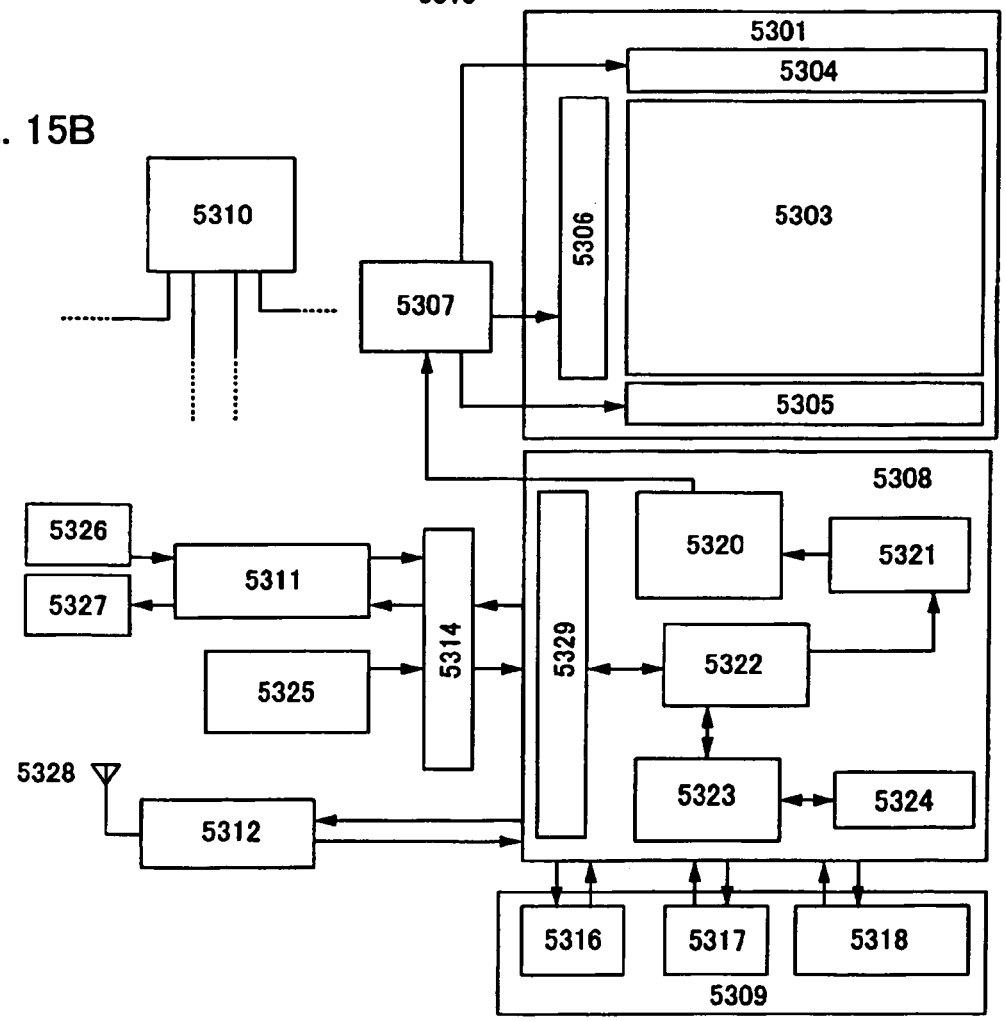

FIG. 15(B) shows a block diagram of the module shown in FIG. 15(A). This module includes a VRAM 5316, a DRAM 5317, and a flash memory 5318 as the memory 5309. Image data to be displayed on the panel, image data or sound data, and various programs are respectively stored in the VRAM 5316, the DRAM 5317, and the flash memory.

The power supply circuit 5310 supplies power that makes the display panel 5301, the controller 5307, the CPU 5308, the sound processing circuit 5311, the memory 5309, and the transmit-receive circuit 5312 operate. In addition, depending on the specification of the panel, the power supply circuit 5310 is sometimes provided with a current source.

The CPU 5308 has a control signal generation circuit 5320, a decoder 5321, a register 5322, a operational circuit 5323, a RAM 5324, an interface 5329 for the CPU 5308, and the like. Various types of signals input through the interface 5329 to the CPU 5308 are once held in the register 5322, and then input into the operational circuit 5323, the decoder 5321, and the like. In the operational circuit 5323, operation is carried out based on the input signals, and locations to which various types of instructions are transmitted are specified. On the other hand, the signal input into the decoder 5321 is decoded and input in the control signal generation circuit 5320. Based on the input signal, the control signal generation circuit 5320 generates signals including various types of instructions, and transmits the signals to the locations specified by the operational circuit 5323, specifically, the memory 5309, the transmit-receive circuit 5312, the sound processing circuit 5311, the controller 5307, and the like.

Each of the memory 5309, the transmit-receive circuit 5312, the sound processing circuit 5311, and the controller 5307 operates in accordance with the received instruction. The operations will be briefly described below.

A signal input from an input means 5325 is transmitted through the interface 5314 to the CPU 5308 mounted on the printed wiring board 5302. The control signal generation circuit 5320 coverts image data stored in the VRAM 5316 into a predetermined format in accordance with the signal transmitted from the input means 5325 such as a pointing device or a keyboard, and transmits to the controller 5307.

The controller 5307 gives data processing to the signal including the image data transmitted from the CPU 5308 in accordance with the panel specification, and supplies to the display panel 5301. In addition, the controller 5307 generates, based on a power supply voltage input from the power supply circuit 5310 and various types of signals input from the CPU 5308, a Hsync signal, a Vsync signal, a clock signal CLK, an alternating voltage (AC Cont), and a switching signal L/R, and supplies to the display panel 5301.

In the transmit-receive circuit 5312, signals that are as radio waves transmitted and received at an antenna 5328 is processed, and specifically, high-frequency circuits such as an isolator, a band pass filter, VCO (Voltage Controlled Oscillator), an LPF (Low Pass Filter), a coupler, and a balun are included. In the transmit-receive circuit 5312, a signal including sound information among signals that are transmitted and received is transmitted to the sound processing circuit 5311 in accordance with an instruction from the CPU 5308.

The signal including the sound information, which has been transmitted in accordance with the instruction of the CPU 5308, is demodulated into a sound signal in the sound processing circuit 5311, and transmitted to a speaker 5327. In addition, a sound signal transmitted from a microphone 5326 is modulated in the sound processing circuit 5311, and transmitted to the transmit-receive circuit 5312 in accordance with an instruction from the CPU 5308.

The controller, 5307, the CPU 5308, the power supply circuit 5310, the sound processing circuit 5311, and the memory 5309 can be mounted as a package of the present embodiment. The present invention can be applied to any circuits but high-frequency circuits such as an isolator, a band pass filter, VCO (Voltage Controlled Oscillator), an LPF (Low Pass Filter), a coupler, and a balun.

Figure 16:
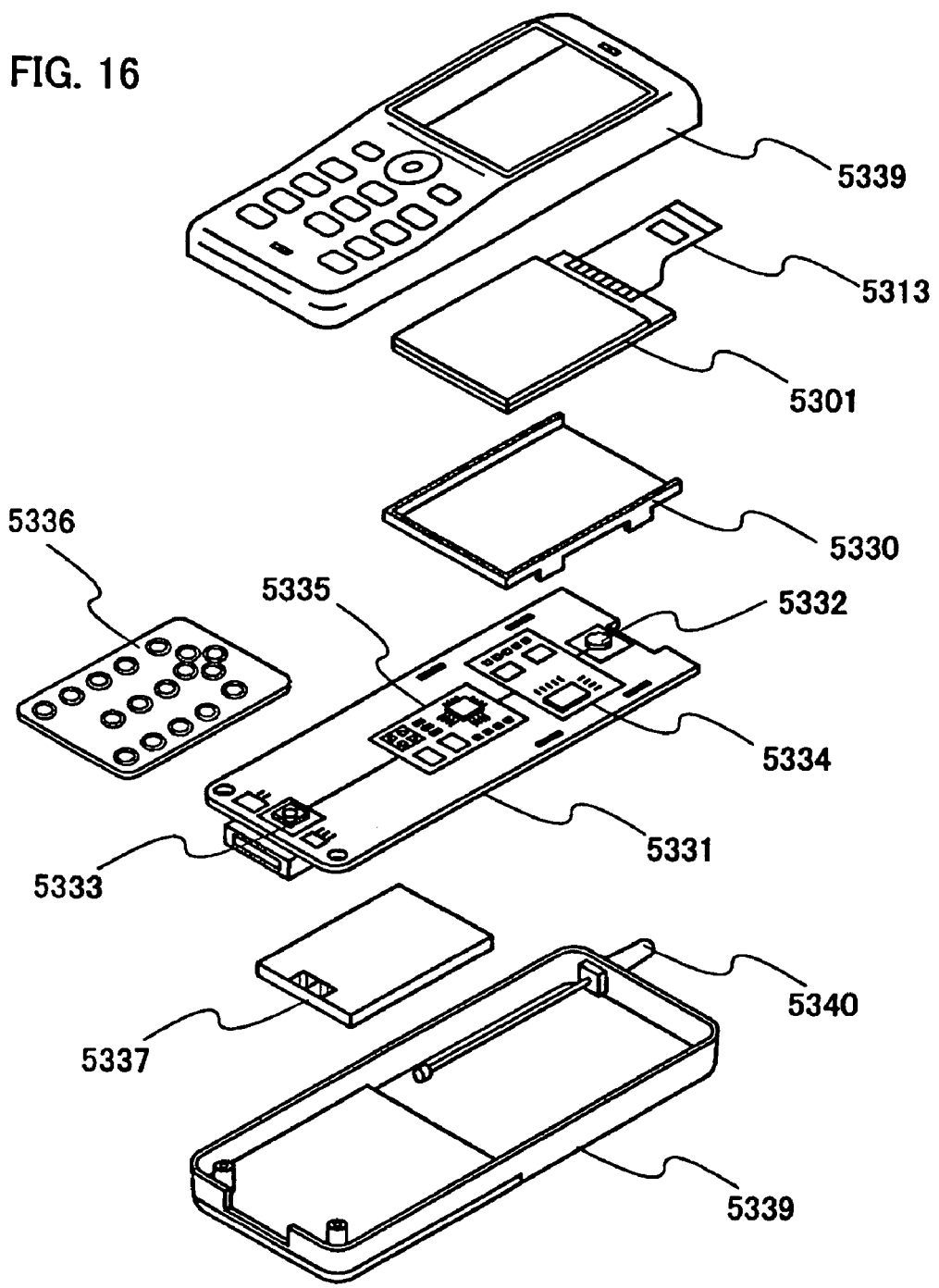
FIG. 16 illustrates an example of electronic devices to which the present invention is applied.

FIG. 16 shows one mode of a cellular phone including the module shown in FIGS. 15(A) and 15(B). The display panel 5301 is incorporated in a housing 5330 with removability. The shape and size of the housing 5330 can be appropriately changed depending on the size of the display panel 5301. The housing 5330 fixing the display panel 5301 is attached a printed board 5331 to assemble a module.

The display panel 5301 is connected to the printed board 5331 with the FPC 5313. On the printed board 5331, a speaker 5332, a microphone 5333, a transmit-receive circuit 5334, and a signal processing circuit 5335 including a CPU, a controller, and the like are formed. This module is combined with an input means 5336, a battery 5337, and an antenna 5340, and put in a housing 5339. The pixel portion of the display panel 5301 is arranged to be visible from an open window formed in the housing 5339.

The cellular phone according to the present embodiment can be changed in various forms depending on the function or use thereof. For example, also when the cellular phone is provided with a plurality of panels or the housing is appropriately divided into a plurality of parts to be made retractable with a hinge, the effect described above can be achieved.

By using the present invention for the cellular phone shown in FIGS. 15(A) and 15(B) and FIG. 16, a favorable cellular phone with high reliability can be obtained.

Figure 17A:
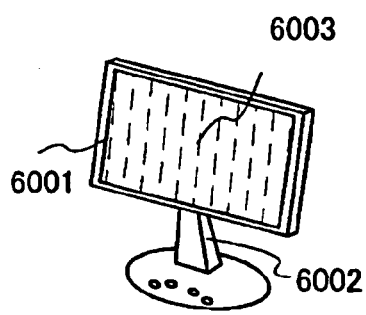
FIG. 17 illustrates examples of electronic devices to which the present invention is applied.

FIG. 17(A) is an EL display, which is composed of a housing 6001, a support 6002, a display portion 6003, and the like. The present invention is applicable to the display portion 6003 with the use of the structures of the EL module shown in FIG. 12 and the display panel shown in FIG. 15(A).

By using the present invention, a favorable display with high reliability can be obtained.

Figure 17B:
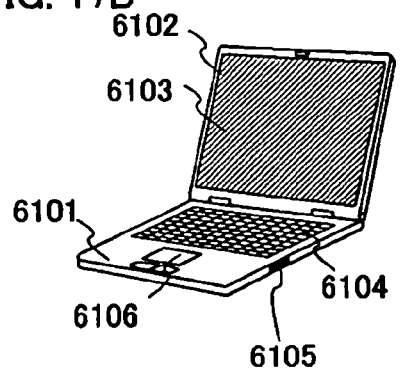

FIG. 17(B) is a computer, which includes a main body 6101, a housing 6102, a display portion 6103, a keyboard 6104, an external connection port 6105, and a pointing mouse 6106. The present invention can be applied to the display portion 6103 with the use of the structures of the EL module shown in FIG. 12 and the display panel shown in FIG. 15(A).

By using the present invention, a favorable computer with high reliability can be obtained.

Figure 17C:
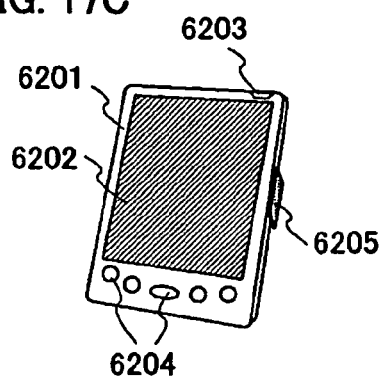

FIG. 17(C) is a portable computer, which includes a main body 6201, a display portion 6202, a switch 6203, an operation key 6204, and an infrared port 6205. The present invention can be applied to the display portion 6202 with the use of the structures of the EL module shown in FIG. 12 and the display panel shown in FIG. 15(A).

By using the present invention, a favorable computer with high reliability can be obtained.

Figure 17D:
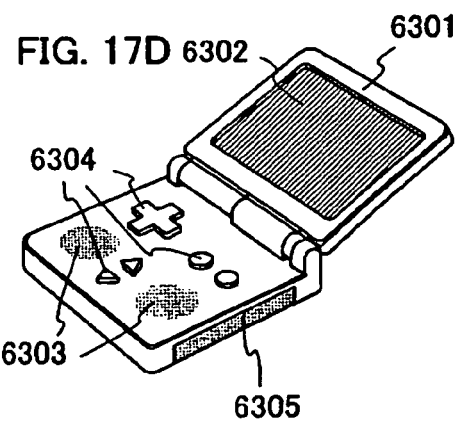

FIG. 17(D) is a portable game machine, which includes a housing 6301, a display portion 6302, a speaker portion 6303, an operation key 6304, a recording medium insert portion 6305. The present invention can be applied to the display portion 6302 with the use of the structures of the EL module shown in FIG. 12 and the display panel shown in FIG. 15(A).

By using the present invention, a favorable game machine with high reliability can be obtained.

Figure 17E:
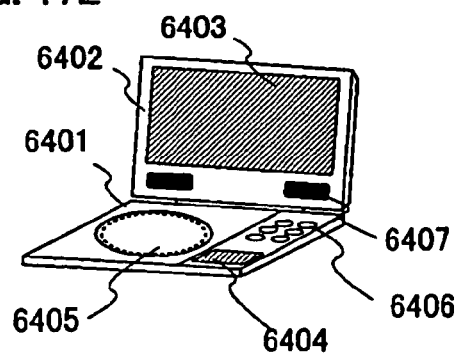

FIG. 17(E) is a portable image reproduction system provided with a recording medium (specifically, a DVD reproduction system), which includes a main body 6401, a housing 6402, a display portion A 6403, a display portion B 6404, a recording medium (such as a DVD) reading portion 6405, an operation key 6406, and a speaker portion 6407. The display portion A 6403 displays mainly image information, while the display portion B 6404 displays mainly character information. The present invention can be applied to the display portion A 6403 and the display portion B 6404 with the use of the structures of the EL module shown in FIG. 12 and the display panel shown in FIG. 15(A). It is to be noted that the image reproduction system provided with a recording medium includes a home game machine.

By using the present invention, a favorable image reproduction system with high reliability can be obtained.

Alternatively, the electronic devices shown in FIGS. 12, 13, 14(A) and 14(B), 15(A) and 15(B), 16, and 17(A) to 17(E) may be manufactured in combination with a liquid crystal display (Liquid Crystal Display (LCD)) manufactured by using the present invention. This LCD can be manufactured by using the TFTs described in Embodiment 2 for a pixel portion and a driving circuit.

For the display devices to be used for these electronic devices, plastic substrates can be used as well as glass substrates depending on the sizes, strengths, or the intended uses whereby reduction in weight can be achieved.

It is to be noted that the examples shown in the present embodiment are just examples, and it is not to be considered limited to these applications.

In addition, the present embodiment can be practiced freely in combination with any descriptions of Embodiment Mode and Embodiments 1 to 3.

The invention claimed is:

1. A method for manufacturing a semiconductor device, comprising the steps of:
    forming a transparent conductive film;
    forming a first conductive film over the transparent conductive film;
    forming a second conductive film over the first conductive film;
    forming a mask over the second conductive film;
    etching the second conductive film with a gas including chlorine using the mask; and
    etching the first conductive film with a gas including fluorine.

2. The method according to claim 1, wherein the transparent conductive film is any one of an indium tin oxide alloy (Indium Tin Oxide (ITO)) film, an indium tin oxide alloy film containing silicon (Si), a zinc oxide (ZnO) film, a tin oxide ($SnO_2$) film, an indium oxide (InO) film, and an indium oxide-zinc oxide (IZO) alloy film of indium oxide (InO) mixed with 2 to 20 atomic % zinc oxide (ZnO).

3. The method according to claim 1, wherein the first conductive film includes any one of molybdenum (Mo), tungsten (W), tantalum (Ta), chromium (Cr), a nitride thereof, and an alloy thereof.

4. The method according to claim 1, wherein the second conductive film is any one of an aluminum film, an aluminum alloy film including at least one element of nickel (Ni), molybdenum (Mo), silicon (Si), titanium (Ti), neodymium (Nd), and copper (Cu), an aluminum alloy film including at least one element of nickel (Ni), cobalt (Co), molybdenum (Mo), silicon (Si), titanium (Ti), neodymium (Nd), and copper (Cu) and including carbon (C).

5. The method according to claim 1, wherein the gas including chlorine is a gas including any one of $Cl_2$, $BCl_3$, $SiCl_4$, and $CCl_4$.

6. The method according to claim 1, wherein the gas including fluorine is a gas including any one of $CF_4$, $SF_6$, and $NF_3$.

7. The method according to claim 1, wherein an organic compound layer including a light-emitting layer is formed over the transparent conductive film.

8. A method for manufacturing a semiconductor device, comprising the steps of:
   forming a semiconductor film over a substrate with an insulating surface;
   forming an insulating film to cover the semiconductor film;
   forming a transparent conductive film over the insulating film;
   forming a contact hole in the insulating film;
   forming a first conductive film over the transparent conductive film and in the contact hole;
   forming a second conductive film over the first conductive film;
   forming a mask over the second conductive film;
   etching the second conductive film with a gas including chlorine using the mask; and
   etching the first conductive film with a gas including fluorine,
   wherein the transparent conductive film is electrically connected to the semiconductor film.

9. The method according to claim 8, wherein the transparent conductive film is any one of an indium tin oxide alloy (Indium Tin Oxide (ITO)) film, an indium tin oxide alloy film containing silicon (Si), a zinc oxide (ZnO) film, a tin oxide ($SnO_2$) film, an indium oxide (InO) film, and an indium oxide-zinc oxide (IZO) alloy film of indium oxide (InO) mixed with 2 to 20 atomic % zinc oxide (ZnO).

10. The method according to claim 8, wherein the first conductive film includes any one of molybdenum (Mo), tungsten (W), tantalum (Ta), chromium (Cr), a nitride thereof, and an alloy thereof.

11. The method according to claim 8, wherein the second conductive film is any one of an aluminum film, an aluminum alloy film including at least one element of nickel (Ni), molybdenum (Mo), silicon (Si), titanium (Ti), neodymium (Nd), and copper (Cu), an aluminum alloy film including at least one element of nickel (Ni), cobalt (Co), molybdenum (Mo), silicon (Si), titanium (Ti), neodymium (Nd), and copper (Cu) and including carbon (C).

12. The method according to claim 8, wherein the gas including chlorine is a gas including any one of $Cl_2$, $BCl_3$, $SiCl_4$, and $CCl_4$.

13. The method according to claim 8, wherein the gas including fluorine is a gas including any one of $CF_4$, $SF_6$, and $NF_3$.

14. A method for manufacturing a semiconductor device, comprising the steps of:
   forming a semiconductor film over a substrate with an insulating surface;
   forming an insulating film to cover the semiconductor film;
   forming a transparent conductive film over the insulating film;
   forming a contact hole in the insulating film;
   forming a first conductive film over the transparent conductive film and in the contact hole;
   forming a second conductive film over the first conductive film;
   forming a mask over the second conductive film;
   etching the second conductive film with a gas including chlorine using the mask;
   etching the first conductive film with a gas including fluorine; and
   forming an organic compound layer including a light-emitting layer over the transparent conductive film;
   wherein the transparent conductive film is electrically connected to the semiconductor film.

15. The method according to claim 14, wherein the transparent conductive film is any one of an indium tin oxide alloy (Indium Tin Oxide (ITO)) film, an indium tin oxide alloy film containing silicon (Si), a zinc oxide (ZnO) film, a tin oxide ($SnO_2$) film, an indium oxide (InO) film, and an indium oxide-zinc oxide (IZO) alloy film of indium oxide (InO) mixed with 2 to 20 atomic % zinc oxide (ZnO).

16. The method according to claim 14, wherein the first conductive film includes any one of molybdenum (Mo), tungsten (W), tantalum (Ta), chromium (Cr), a nitride thereof, and an alloy thereof.

17. The method according to claim 14, wherein the second conductive film is any one of an aluminum film, an aluminum alloy film including at least one element of nickel (Ni), molybdenum (Mo), silicon (Si), titanium (Ti), neodymium (Nd), and copper (Cu), an aluminum alloy film including at least one element of nickel (Ni), cobalt (Co), molybdenum (Mo), silicon (Si), titanium (Ti), neodymium (Nd), and copper (Cu) and including carbon (C).

18. The method according to claim 14, wherein the gas including chlorine is a gas including any one of $Cl_2$, $BCl_3$, $SiCl_4$, and $CCl_4$.

19. The method according to claim 14, wherein the gas including fluorine is a gas including any one of $CF_4$, $SF_6$, and $NF_3$.

* * * * *